United States Patent
Fukuura

(10) Patent No.: US 9,401,497 B2
(45) Date of Patent: Jul. 26, 2016

(54) METAL-BASED PARTICLE ASSEMBLY

(71) Applicant: SUMITOMO CHEMICAL COMPANY, LIMITED, Tokyo (JP)

(72) Inventor: Tomohiro Fukuura, Tsukuba (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 14/428,527

(22) PCT Filed: Sep. 2, 2013

(86) PCT No.: PCT/JP2013/073533
§ 371 (c)(1),
(2) Date: Mar. 16, 2015

(87) PCT Pub. No.: WO2014/045851
PCT Pub. Date: Mar. 27, 2014

(65) Prior Publication Data
US 2015/0243931 A1    Aug. 27, 2015

(30) Foreign Application Priority Data
Sep. 18, 2012 (JP) .................................. 2012-204493

(51) Int. Cl.
*H01L 33/00* (2010.01)
*H01L 51/52* (2006.01)
(Continued)

(52) U.S. Cl.
CPC ...... *H01L 51/5268* (2013.01); *H01L 31/02168* (2013.01); *H01L 31/02366* (2013.01);
(Continued)

(58) Field of Classification Search
CPC ................... H01L 51/5268; H01L 31/02168; H01L 31/02366; H01L 31/055; H01L 51/502; H01L 51/447; H01L 2251/558
See application file for complete search history.

(56) References Cited

U.S. PATENT DOCUMENTS

| 5,866,433 A | 2/1999 | Schalkhammer et al. |
| 2006/0279738 A1 | 12/2006 | Ogawa et al. |

(Continued)

FOREIGN PATENT DOCUMENTS

| EP | 2693846 A1 | 2/2014 |
| JP | 8-271431 A | 10/1996 |

(Continued)

OTHER PUBLICATIONS

Tomohiro Fukuura, et al., "Long Range Enhancement of Molecular Fluorescence by CO1 Closely Packed Submicro-scale Ag Islands", e-Journal of Surface Science and Nanotechnology, 2009, pp. 653-659, vol. 7.

(Continued)

*Primary Examiner* — Thanh Y Tran
(74) *Attorney, Agent, or Firm* — Sughrue Mion, PLLC

(57) ABSTRACT

Provided are a metal-based particle assembly comprising 30 or more metal-based particles separated from each other and disposed in two dimensions, the metal-based particles having an average particle diameter of 200 to 1600 nm, an average height of 55 to 500 nm, and an aspect ratio, as defined by a ratio of the average particle diameter to the average height, of 1 to 8, the metal-based particle assembly having a scattering intensity ratio $S_1/S_0$ of not less than 0.15, $S_1$ representing a scattering intensity at a maximum wavelength of a peak having a highest peak intensity in a scattering spectrum of light scattered at an angle of 30° from light incident on a surface of the metal-based particle assembly along a normal to the surface, $S_0$ representing a scattering intensity of the peak for a reference system made of a barium sulfate layer, and an optical device including the assembly.

10 Claims, 14 Drawing Sheets

(51) Int. Cl.
*H01L 31/0216* (2014.01)
*H01L 31/0236* (2006.01)
*H01L 31/055* (2014.01)
*H01L 31/04* (2014.01)
*H01L 31/052* (2014.01)
*H05B 33/02* (2006.01)
*H05B 33/14* (2006.01)
*H01L 51/44* (2006.01)

(52) U.S. Cl.
CPC .............. *H01L31/04* (2013.01); *H01L 31/052* (2013.01); *H01L 31/055* (2013.01); *H05B 33/02* (2013.01); *H05B 33/14* (2013.01); *H01L 51/447* (2013.01); *H01L 2251/558* (2013.01); *Y02E 10/52* (2013.01); *Y10T 428/12014* (2015.01); *Y10T 428/25* (2015.01)

(56) References Cited

U.S. PATENT DOCUMENTS

| | | | |
|---|---|---|---|
| 2007/0114523 A1 | 5/2007 | Oumi et al. | |
| 2007/0115474 A1 | 5/2007 | Chaton et al. | |
| 2007/0146887 A1* | 6/2007 | Ikeda | G02B 1/111 |
| | | | 359/586 |
| 2009/0079988 A1 | 3/2009 | Narahara et al. | |
| 2010/0046077 A1 | 2/2010 | Lee et al. | |
| 2010/0238548 A1 | 9/2010 | Watanabe et al. | |
| 2012/0043532 A1 | 2/2012 | Yasuda et al. | |
| 2012/0325301 A1 | 12/2012 | Misawa et al. | |
| 2013/0081683 A1 | 4/2013 | Masunaga et al. | |
| 2014/0011043 A1* | 1/2014 | Fukuura | H05B 33/24 |
| | | | 428/566 |
| 2014/0017507 A1* | 1/2014 | Fukuura | B82Y 20/00 |
| | | | 428/546 |
| 2014/0238492 A1* | 8/2014 | Fukuura | H01L 51/4253 |
| | | | 136/263 |
| 2015/0001464 A1* | 1/2015 | Fukuura | H05B 33/14 |
| | | | 257/13 |
| 2015/0069237 A1* | 3/2015 | Yagami | H04N 5/33 |
| | | | 250/332 |

FOREIGN PATENT DOCUMENTS

| | | |
|---|---|---|
| JP | 2004-61853 A | 2/2004 |
| JP | 2007-17432 A | 1/2007 |
| JP | 2007-501391 A | 1/2007 |
| JP | 2007-139540 A | 6/2007 |
| JP | 2007-165284 A | 6/2007 |
| JP | 2009-74947 A | 4/2009 |
| JP | 2010-15109 A | 1/2010 |
| JP | 2010-238775 A | 10/2010 |
| WO | 2005/017570 A2 | 2/2005 |
| WO | 2005/033335 A2 | 4/2005 |
| WO | 2008/082569 A1 | 7/2008 |
| WO | 2011/027830 A1 | 3/2011 |
| WO | 2011/125101 A1 | 10/2011 |

OTHER PUBLICATIONS

K. Lance Kelly, et al., "The Optical Properties of Metal Nanoparticles: The Influence of Size, Shape, and Dielectric Environment", The Journal of Physical Chemistry B, 2003, pp. 668-677, vol. 107.

International Search Report for PCT/JP2013/073533 dated Oct. 1, 2013 [PCT/ISA/210].

Communication dated Apr. 1, 2016, issued by the European Patent Office in corresponding European Application No. 13838545.5.

* cited by examiner

ENLARGED

METAL-BASED PARTICLE ASSEMBLY

CROSS REFERENCE TO RELATED APPLICATIONS

This application is a National Stage of International Application No. PCT/JP2013/073533, filed on Sep. 2, 2013, which claims priority from Japanese Patent Application No. 2012-204493, filed on Sep. 18, 2012, the contents of all of which are incorporated herein by reference in their entirety.

TECHNICAL FIELD

The present invention relates to a metal-based particle assembly that is a plasmonic material useful for light emitting devices (organic electroluminescence (EL) devices, inorganic EL devices, inorganic light emitting diode (LED) devices, and the like) to provide improved luminous efficiency and for photoelectric conversion devices (solar cell devices) to provide improved conversion efficiency and the like.

BACKGROUND ART

It has conventionally been known that making metal particles small to be nano-sized presents functions that are not observed when they are in a bulk state, and localized plasmon resonance is in particular expected for application. Plasmon is a compressional wave of free electrons that arises by collective oscillation of the free electrons in a metallic nanostructure.

In recent years, a field of art handling the plasmon is referred to as plasmonics and attracts large attention, and has also been actively studied and such study includes exploiting phenomena of localized plasmon resonance of a metal nanoparticle to be intended for improvements of light emitting devices in luminous efficiency and improvements of photoelectric conversion devices (solar cell devices) in conversion efficiency.

Japanese Patent Laying-Open Nos. 2007-139540 (PTD 1) and 08-271431 (PTD 2) and WO2005/033335 (PTD 3), for example, disclose techniques exploiting localized plasmon resonance for enhanced fluorescence. Furthermore, T. Fukuura and M. Kawasaki, "Long Range Enhancement of Molecular Fluorescence by Closely Packed Submicro-scale Ag Islands", e-Journal of Surface Science and Nanotechnology, 2009, 7, 653 (NPD 1) indicates a study on localized plasmon resonance of silver nanoparticles.

CITATION LIST

Patent Documents

PTD 1: Japanese Patent Laying-Open No. 2007-139540
PTD 2: Japanese Patent Laying-Open No. 08-271431
PTD 3: WO2005/033335

Non Patent Document

NPD 1: T. Fukuura and M. Kawasaki, "Long Range Enhancement of Molecular Fluorescence by Closely Packed Submicro-scale Ag Islands", e-Journal of Surface Science and Nanotechnology, 2009, 7, 653.

SUMMARY OF INVENTION

Technical Problem

Exploiting the metal nanoparticle's localized plasmon resonance to enhance emission, as conventional, is, however, accompanied by the following issue. More specifically, there are two factors for a metal nanoparticle to act to enhance emission: 1) an electric field near the metal nanoparticle is enhanced through the generation of localized plasmon in the particle (a first factor); and 2) energy transfer from a molecule excited excites an oscillation mode of a free electron in the metal nanoparticle, which causes a radiative induced dipole in the metal nanoparticle larger than a radiative dipole of the excited molecule, and luminescent quantum efficiency per se thus increases (a second factor). In order to effectively cause, in the metal nanoparticle, the radiative induced dipole that is involved in the second factor, which is a larger factor, it is required that the metal nanoparticle and the molecule to be excited (such as fluorescent material) have a distance therebetween within a range disallowing energy transfer which is a direct electron transfer based on the Dexter mechanism to occur but allowing energy transfer based on the Förster mechanism to occur (i.e., a range of 1 nm to 10 nm). This is because the radiative induced dipole is caused based on the theory of Förster's energy transfer (see NPD 1 above).

In general, within the range of 1 nm to 10 nm, the metal nanoparticle and the molecule to be excited with a smaller distance therebetween facilitate causing the radiative induced dipole and allow an increased emission enhancement effect, whereas the metal nanoparticle and the molecule to be excited with a larger distance therebetween result in ineffective localized plasmon resonance and hence a gradually reduced emission enhancement effect, and the metal nanoparticle and the molecule to be excited with a distance therebetween exceeding the range allowing the Forster mechanism to present energy transfer (i.e., approximately 10 nm or larger in general) failed to provide a substantial emission enhancement effect. Also in the emission enhancement methods disclosed by PTDs 1-3, an effective distance between a metal nanoparticle and a molecule to be excited should be 10 nm or smaller to obtain an effective emission enhancement effect.

Localized plasmon resonance via a conventional metal nanoparticle thus has such an essential issue that it has an effect in an extremely limited range of 10 nm or smaller from a surface of the metal nanoparticle. This issue necessarily invites such an issue that attempts applying the localized plasmon resonance via the metal nanoparticle to a light emitting device, a photoelectric conversion device or the like aimed at improving luminous efficiency or conversion efficiency are not observed to provide substantial improvement effects. More specifically, a light emitting device, a photoelectric conversion device and the like normally have an active layer (e.g., a light emitting layer for the light emitting device, a light-absorbing layer for the photoelectric conversion device, and the like) having the thickness of several tens nm or larger, and even if the metal nanoparticle can be disposed adjacent to or in the active layer, a direct enhancement effect via localized plasmon resonance can only be obtained at an extremely small portion of the active layer.

The present invention has been made in view of the above issue, and an object thereof is to provide a novel plasmonic material that can present significantly intense plasmon resonance and also allows the plasmon resonance to have an effect over a significantly extended long distance.

Solution to Problem

PTD 1 (see paragraphs 0010-0011) provides a theoretical explanation of a relationship between emission enhancement through localized plasmon resonance and a metal nanoparticle's particle diameter, and according to this explanation, when a spherical silver particle having a particle diameter of approximately 500 nm is used, while luminous efficiency φ of approximately one is theoretically provided, in reality such a silver particle does not present a substantial effect to enhance emission. Such a large-size silver particle does not present a substantial effect to enhance emission because it is inferred that the silver particle has an excessively large number of surface free electrons therein, and accordingly, dipole-type localized plasmon observed in a typical nanoparticle (a nanoparticle having a relatively small particle diameter) is not easily generated. It is believed, however, that if a significantly large number of surface free electrons that the large-size nanoparticle has therein can be effectively excited as plasmon, the plasmon would be expected to contribute to drastically more effective enhancement.

As a result of a diligent study, the present inventor has found that a metal-based particle assembly that is formed of at least a specific number of large-size metal-based particles having a specific shape and disposed in two dimensions with a spacing therebetween and that presents a prescribed light scattering characteristic, can not only present significantly intense plasmon resonance but also allows the plasmon resonance to have an effect over a significantly extended range (or a plasmonic enhancement effect to cover the range).

More specifically, the present invention includes the following:

[1] A metal-based particle assembly comprising 30 or more metal-based particles separated from each other and disposed in two dimensions, said metal-based particles having an average particle diameter in a range of from 200 to 1600 nm, an average height in a range of from 55 to 500 nm, and an aspect ratio, as defined by a ratio of said average particle diameter to said average height, in a range of from 1 to 8, the metal-based particle assembly having a scattering intensity ratio $S_1/S_0$ equal to or larger than 0.15, $S_1$ representing a scattering intensity at a maximum wavelength of a peak having a highest peak intensity, as observed in a scattering spectrum of light scattered at an angle of 30° from light incident on a surface of the metal-based particle assembly along a normal to the surface, $S_0$ representing a scattering intensity of said peak for a reference system made of a barium sulfate layer.

[2] The metal-based particle assembly according to item [1], wherein said metal-based particles are oblate particles with said aspect ratio of more than one.

[3] The metal-based particle assembly according to item [1] or [2], wherein said metal-based particles are made of silver.

[4] The metal-based particle assembly according to any one of items [1] to [3], wherein said metal-based particles are non-conductive between adjacent metal-based particles.

[5] A metal-based particle assembly film-layered substrate comprising: a substrate; and a film composed of the metal-based particle assembly according to any one of items [1] to [4] and layered on said substrate.

[6] The metal-based particle assembly film-layered substrate according to item [5], having in an absorption spectrum for a visible light region a maximum wavelength of a peak at a longest side in wavelength, the maximum wavelength being in a range of from 350 to 550 nm.

[7] The metal-based particle assembly film-layered substrate according to item [5] or [6], having in an absorption spectrum for a visible light region a maximum wavelength of a peak at a longest side in wavelength, an absorbance at the maximum wavelength being at least one.

[8] The metal-based particle assembly film-layered substrate according to any one of items [5] to [7], further comprising an insulating layer covering a surface of each metal-based particle that composes said film.

[9] An optical device comprising: an active layer having the thickness of at least 10 nm; and the metal-based particle assembly according to any one of items [1] to [4] or the metal-based particle assembly film-layered substrate according to any one of items [5] to [8].

[10] The optical device according to item [9], wherein a maximum wavelength of at least one peak in an emission spectrum or an absorption spectrum that said active layer presents and said maximum wavelength in said scattering spectrum that said metal-based particle assembly presents have a difference in absolute value of equal to or smaller than 200 nm.

In the present specification, a metal-based particle assembly layered on a substrate will be referred to as a metal-based particle assembly film-layered substrate. Furthermore, in the present specification, an active layer is a concept including a light absorbing layer that is an active layer of a photoelectric conversion device (a solar cell device), and a light emitting layer that is an active layer of a light emitting device, for example.

Advantageous Effect of Invention

When the metal-based particle assembly and metal-based particle assembly film-layered substrate of the present invention are compared with a conventional plasmonic material, the former present significantly intense plasmon resonance and also allow the plasmon resonance to have an effect over a significantly extended range (or a plasmonic enhancement effect to cover the range). The metal-based particle assembly and metal-based particle assembly film-layered substrate of the present invention are significantly useful as an enhancement element for an optical device such as a light emitting device, a photoelectric conversion device (a solar cell device) or the like, and allow an optical device therewith to provide significant improvements of luminous efficiency or conversion efficiency.

DESCRIPTION OF EMBODIMENTS

Figure 1A:
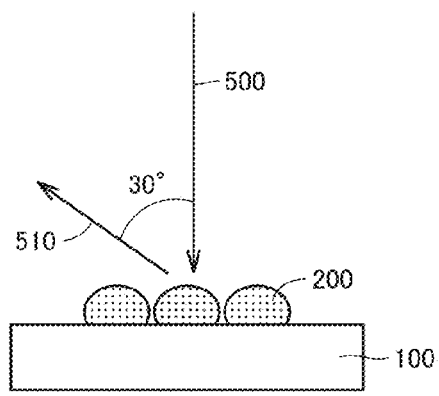
FIGS. 1A and 1B are schematic diagrams for illustrating a method of measuring a scattering intensity $S_1$ of a metal-based particle assembly and a scattering intensity $S_0$ of a reference system.

<Metal-Based Particle Assembly and Metal-Based Particle Assembly Film-Layered Substrate>

The present invention provides a metal-based particle assembly that is a particle assembly comprising 30 or more metal-based particles separated from each other and disposed in two dimensions, and a metal-based particle assembly film-layered substrate that is a substrate having the metal-based particle assembly layered (or carried) thereon. The metal-based particles that compose the metal-based particle assembly have an average particle diameter in a range of from 200 to 1600 nm, an average height in a range of from 55 to 500 nm, and an aspect ratio, as defined by a ratio of the average particle diameter to the average height, in a range of from 1 to 8.

The metal-based particle assembly of the present invention is characterized as follows: when the metal-based particle assembly is subjected to measurement, with light incident on a surface thereof along a normal thereto, to obtain a scattering spectrum of light scattered from the incident light at an angle of 30° (or a relation curve represented with an axis of abscissa representing wavelength of the scattered light and an axis of ordinate representing scattering intensity), a peak is observed in the scattering spectrum with a peak intensity that is highest in the scattering spectrum (hereinafter also referred to as a scattering intensity $S_1$ at the maximum wavelength of the peak), whereas when a reference system made of a barium sulfate layer is subjected to measurement under the same condition to obtain such a scattering spectrum as described above, a peak is observed in the scattering spectrum with a peak intensity that is highest in the scattering spectrum (hereinafter also referred to as a scattering intensity $S_0$ at the maximum wavelength of the peak), and a scattering intensity ratio $S_1/S_0$ is equal to or larger than 0.15.

The metal-based particle assembly of the present invention that is formed of at least a specific number of metal-based particles having a specific shape and disposed in two dimensions with a spacing therebetween and presents a prescribed light scattering characteristic, can not only present significantly intense plasmon resonance but also allows the plasmon resonance to have an effect over a significantly extended range. It is believed that this is because at least a specific number of metal-based particles that have a specific shape and are disposed in two dimensions with a spacing therebetween allow localized plasmons generated at individual metal-based particles to interact with each other so that a significantly large number of surface free electrons that relatively large-size metal-based particles have individually at their surfaces are excited as unique plasmon in the particle assembly.

The metal-based particle assembly of the present invention presents plasmon resonance having an intensity that is not a simple sum total of localized plasmon resonances that individual metal-based particles exhibit for a specific wavelength; rather, it can present an intensity larger than that. This is believed to result as localized plasmons generated at individual metal-based particles interact with each other. Generally, when a plasmonic material is subjected to absorption spectrum measurement through absorptiometry, a steep peak in an ultraviolet to visible light region is observed as a plasmon resonance peak (hereinafter also simply referred to as "plasmon peak"), and this plasmon peak's absorbance value in magnitude at a maximum wavelength thereof can be used to easily evaluate the plasmonic material's plasmon resonance in intensity, and when the metal-based particle assembly of the present invention that is layered on a substrate (a glass substrate) (i.e., a metal-based particle assembly film layered on the glass substrate) is subjected to absorption spectrum measurement through absorptiometry, it can present for a visible light region a maximum wavelength of a plasmon peak at a longest side in wavelength, and an absorbance at the maximum wavelength can be 1 or larger, further 1.5 or larger, and still further approximately 2.

Conventionally, plasmon resonance has an effect over a range that is generally limited to that of the Förster distance (i.e., approximately 10 nm or smaller), whereas the metal-based particle assembly of the present invention allows the range to be extended for example to approximately several hundreds nm. Plasmon resonance having an effect over an extended range is significantly advantageous in enhancing optical devices such as light emitting devices, photoelectric conversion devices and the like. The plasmon resonance having an effect over the significantly extended range allows an active layer (e.g., a light emitting layer for the light emitting device, a light-absorbing layer for the photoelectric conversion device, and the like) typically having the thickness of several tens nm or larger to be entirely enhanced, which can significantly improve the optical device's luminous efficiency, conversion efficiency and/or the like.

Furthermore, while a conventional plasmonic material needs to be disposed to have a distance to an active layer within the range of the Förster distance, the present invention can achieve effective enhancement via plasmon resonance with a plasmonic material disposed at a position for example 10 nm, further several tens nm (e.g., 20 nm), still further several hundreds nm away from the active layer. This means that, for example for a light emitting device, the plasmonic material, or the metal-based particle assembly, can be disposed in a vicinity of a light extraction face considerably remote from a light emitting layer, and significantly improved light extraction efficiency can thus be achieved. When a conventional plasmonic material is used to produce a light emitting device, the light emitting device necessitates having the plasmonic material disposed significantly close to a light emitting layer and hence significantly remote from a light extraction face, and accordingly, the emitted light would have a large portion thereof totally reflected at an interface of a variety of constituent layers of the light emitting device that the light passes through before it reaches the light extraction face, resulting in significantly small light extraction efficiency.

Figure 1B:
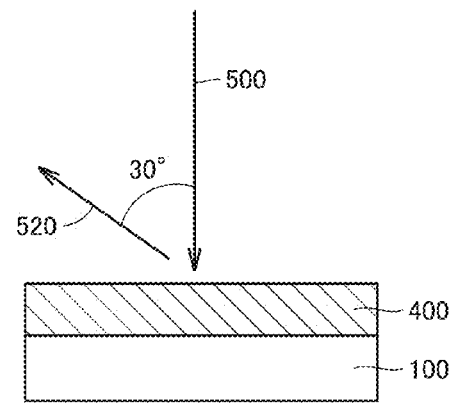

With reference to FIGS. 1A and 1B, a method will be described for measuring scattering intensity $S_1$ of the metal-based particle assembly and scattering intensity $S_0$ of a reference system. With reference to FIG. 1A, scattering intensity $S_1$ is measured as follows: A substrate (a glass substrate) 100 having a film formed of a metal-based particle assembly 200 thereon, i.e., a metal-based particle assembly film-layered substrate, is prepared, and white light is used as light 500 incident on a surface of the film of metal-based particle assembly 200 along a normal to the surface (i.e., in a direction perpendicular to the surface). This causes scattered light, of which scattered light 510 scattered at an angle of 30° from incident light 500 is represented in a scattering spectrum in the form of a relation curve with an axis of abscissa representing wavelength of the scattered light and an axis of ordinate representing scattering intensity. In the obtained scattering spectrum, a scattering intensity at a maximum wavelength of a peak having a highest peak intensity is scattering intensity $S_1$ of the metal-based particle assembly. The present invention only requires that any one of scattered light 510 scattered at an angle of 30° from incident light 500 has scattering intensity ratio $S_1/S_0$ equal to or larger than 0.15.

The reference system's scattering intensity $S_0$ is measured as follows: With reference to FIG. 1B, substrate 100 having a barium sulfate layer 400 deposited thereon, or the reference system's layered substrate, is prepared, and subjected to a measurement under the same condition as that for scattering intensity $S_1$ to obtain a scattering spectrum of scattered light 520 scattered at an angle of 30° from incident light 500. In the obtained scattering spectrum, a scattering intensity at a maximum wavelength of a peak having a highest peak intensity is scattering intensity $S_0$ of the reference system. The reference system's layered substrate is generally referred to as a "standard diffusion plate", and it is a substrate having powdery barium sulfate set flat thereon as barium sulfate layer 400.

The metal-based particle assembly of the present invention presents a steep peak that is attributed to plasmon resonance in the above scattering spectrum's ultraviolet to visible light region (hereinafter also referred to as a "plasmon scattering peak") as a peak having a highest peak intensity, and a ratio of scattering intensity $S_1$ of this plasmon scattering peak to scattering intensity $S_0$, i.e., scattering intensity ratio $S_1/S_0$, is equal to or larger than 0.15. The present inventor has found that there is a tendency that when the present metal-based particle assembly that is formed of at least a specific number of metal-based particles having a specific shape and disposed in two dimensions with a spacing therebetween presents a plasmon scattering peak having scattering intensity ratio $S_1/S_0$ having a larger value, it presents more intense plasmon resonance and also allows the plasmon resonance to have an effect over a more extended range. Accordingly, preferably, scattering intensity ratio $S_1/S_0$ is 0.17 or larger, and more preferably 0.2 or larger.

The plasmon scattering peak's maximum wavelength is controllable by adjusting: the average particle diameter of the metal-based particles that configure the metal-based particle assembly; adjacent metal-based particles' average inter-distance (hereinafter also referred to as an "average interparticle distance"; the metal-based particle's shape; and/or the like. More specifically, when the metal-based particle assembly of the present invention holds a small average interparticle distance and also has metal-based particles with an average particle diameter increased within a range as prescribed in the present invention (i.e., a range of 200-1600 nm) the plasmon scattering peak's maximum wavelength is shifted to a longer side in wavelength. Furthermore, when the individual metal-based particles have an irregular shape such as having small recesses and projections, the plasmon scattering peak's maximum wavelength is shifted to a shorter side in wavelength. The plasmon scattering peak's maximum wavelength can be controlled for example within a wavelength range of 300-900 nm.

As will also be mentioned hereinafter, to more effectively obtain an enhancement effect through plasmon resonance, it is preferable that the maximum wavelength of the plasmon scattering peak of the metal-based particle assembly be maximally close to the maximum wavelength of any peak of an emission spectrum that an active layer of an optical device using it as an enhancement element presents. The two maximum wavelengths can be brought to be maximally close to each other by adjusting the average particle diameter and/or the average interparticle distance to control the plasmon scattering peak's maximum wavelength.

Thus the present invention allows the plasmon scattering peak's maximum wavelength to be shifted to a shorter side in wavelength (i.e., blue-shifted), and such a metal-based particle assembly is significantly advantageous for example as follows: More specifically, while there is a strong demand for a blue luminescent material of high luminous efficiency (or a luminescent material of a wavelength range close thereto; the same applies hereinafter), in particular a blue phosphorescent material, currently it is difficult to develop such a material with sufficiently practical usability. Applying the metal-based particle assembly of the present invention that has a plasmon scattering peak in the blue wavelength range to a light emitting device as an enhancement element allows the light emitting device to have its luminous efficiency enhanced to a sufficient extent even when the light emitting device uses a blue luminescent material of relatively low luminous efficiency. Furthermore, when it is applied to a photoelectric conversion device (a solar cell device), it allows a resonant wavelength to be blue-shifted so that a wavelength range that has not been utilized by the active layer per se can effectively be utilized to result in improved conversion efficiency.

On the other hand, the present invention also allows the plasmon scattering peak's maximum wavelength to be shifted to a longer side in wavelength (i.e., red-shifted), and when such a metal-based particle assembly is applied for example to a photoelectric conversion device, it can efficiently absorb light of a wavelength that a typical photoelectric conversion device's active layer (or light absorbing layer) cannot easily absorb, and the photoelectric conversion device with the present metal-based particle assembly can achieve improved conversion efficiency.

The present inventor has found that the metal-based particle assembly of the present invention presents an absorption spectrum such that a plasmon peak at a longest side in wavelength has a maximum wavelength varying with the plasmon scattering peak's maximum wavelength, and accordingly, the former plasmon peak can also be blue-shifted. When the metal-based particle assembly of the present invention is deposited on a substrate (a glass substrate) i.e., when it is presented as a metal-based particle assembly film-layered glass substrate, and subjected to absorption spectrum measurement in a visible light region through absorptiometry, a plasmon peak observed at a longest side in wavelength can have a maximum wavelength in a wavelength range for example of 350-550 nm. Furthermore, when the metal-based particle assembly of the present invention is compared with metal-based particles disposed with a sufficiently large interparticle distance (for example of 1µm), the former can cause a blue shift of approximately 30-500 nm (e.g., 30-250 nm).

Hereinafter the metal-based particle assembly and metal-based particle assembly film-layered substrate of the present invention will more specifically be described.

The metal-based particles that compose the metal-based particle assembly and metal-based particle assembly film-layered substrate are not specifically restricted as long as made of a material that can present a plasmonic effect when the material is presented in the form of nanoparticles, and the material can include, for example: noble metals such as gold, silver, copper, platinum and palladium; metals such as aluminum and tantalum; alloys containing these noble metals or these metals; and metal compounds including these noble metals or these metals (such as metal oxides, metal salts and the like). Inter alia, noble metals such as gold, silver, copper, platinum and palladium are preferable, and silver is more preferable as it is inexpensive and provides small absorption (or has a small imaginary part of a dielectric function in visible light wavelengths).

The metal-based particles have an average particle diameter within a range of 200-1600 nm, and to provide plasmon resonance increased in intensity and having an effect over an extended range, the metal-based particles have an average particle diameter within a range preferably of 200-1200 nm, more preferably 250-500 nm, still more preferably 300-500 nm. There is a tendency that larger average particle diameters within the range of 200-1600 nm allow the plasmon scattering peak to have larger scattering intensity ratios $S_1/S_0$.

The average particle diameter of the metal-based particle, as referred to herein, is obtained as follows: a metal-based particle assembly (film) having metal-based particles disposed in two dimensions is observed with an SEM from directly above to obtain an SEM image thereof, and therein ten particles are selected at random and in each particle's image 5 tangential diametrical lines are drawn at random (note that the straight lines serving as the tangential diametrical lines can pass through only inside the image of the particle and one of the lines is a straight line passing through only inside the particle and drawable to be the longest) and their average value serves as the particle's diameter and the 10 selected particles' respective such particle diameters are averaged to obtain the average particle diameter of the metal-based particle. The tangential diametrical line is defined as a perpendicular line connecting a spacing between two parallel lines sandwiching the particle's contour (in a projected image) in contact therewith (see the Nikkan Kogyo Shimbun, Ltd., "Particle Measurement Technique", 1994, page 5).

The metal-based particles have an average height within a range of 55-500 nm, and to provide plasmon resonance increased in intensity and having an effect over an extended range, the metal-based particles have an average height within a range preferably of 55-300 nm, more preferably 70-150 nm. The average height of the metal-based particles is obtained as follows: the metal-based particle assembly (film) is observed with an AFM to obtain an AFM image thereof and therein 10 particles are selected at random and measured in height and their measurements are averaged to obtain the average height.

The metal-based particle has an aspect ratio within a range of 1-8, and to provide plasmon resonance increased in intensity and having an effect over an extended range, the metal-based particle has an aspect ratio within a range preferably of 2-8, more preferably 2.5-8. The aspect ratio of the metal-based particle is defined as a ratio of the above average particle diameter to the above average height (i.e., average particle diameter/average height). While the metal-based particle may be spherical, preferably it is oblate having an aspect ratio exceeding one.

While the metal-based particle preferably has a smoothly curved surface in view of exciting significantly effective plasmon and in particular it is more preferable that the metal-based particle be oblate having a smoothly curved surface, the metal-based particle may have a surface with small recesses and projections (or roughness) to some extent and in that sense the metal-based particle may be indefinite in shape.

Preferably, the metal-based particles have variation therebetween in size as minimally as possible in view of uniformity in intensity of plasmon resonance within a plane of the metal-based particle assembly (film). Even if there is a small variation in particle diameter, it is not preferable that large-size particles have an increased distance therebetween and it is preferable that particles of small size be introduced between the large-size particles to help the large-size particles to exhibit their interaction.

The metal-based particle assembly and metal-based particle assembly film-layered substrate of the present invention can have metal-based particles with an average interparticle distance (i.e., an average distance between adjacent metal-based particles) falling within for example in a range of 0.2-150 nm, and to provide plasmon resonance increased in intensity and having an effect over an extended range, the metal-based particles have an average interparticle distance within a range preferably of 1-150 nm, more preferably 1-100 nm, still more preferably 1-50 nm, still more preferably 1-20 nm. When the average interparticle distance exceeds 150 nm, the localized plasmons generated at individual metal-based particles less easily interact with each other, which makes it difficult to obtain plasmon resonance effectively increased in intensity and having an effect over an effectively extended range. When the average interparticle distance is smaller than 0.2 nm it results in significant electron transfer between the metal-based particles through the Dexter mechanism, and hence significantly deactivated localized plasmon, which similarly makes it difficult to obtain plasmon resonance effectively increased in intensity and having an effect over an effectively extended range.

The average interparticle distance, as referred to herein, is obtained as follows. A metal-based particle assembly (film) having metal-based particles disposed in two dimensions is observed with an SEM from directly above to obtain an SEM image thereof, and therein 30 particles are selected at random and for each selected particle an interparticle distance to an immediately adjacent particle is obtained and the 30 particles' such interparticle distances are averaged to obtain an average interparticle distance. In obtaining an interparticle distance to an immediately adjacent particle, a distance to any immediately adjacent particle, as obtained between a surface of the particle of interest and that of the immediately adjacent particle, is measured, and such measurements are averaged to obtain the interparticle distance.

The metal-based particle assembly (film) includes 30 or more metal-based particles, preferably 50 or more metal-based particles. 30 or more metal-based particles assembled together present the metal-based particles' localized plasmons interacting with each other effectively and thus present significantly intense plasmon resonance and its effect over an extended range effectively.

When the metal-based particle assembly or metal-based particle assembly film-layered substrate is applied to an optical device as an enhancement element, then, in light of the optical device's typical device area, the metal-based particle assembly can include 300 or more metal-based particles, and furthermore, 17500 or more metal-based particles, for example.

The metal-based particle assembly (film) includes metal-based particles having a number density preferably of 7 particles/$\mu m^2$ or larger, more preferably 15 particles/$\mu m^2$ or larger. There is a tendency that the metal-based particles with larger number densities allow the plasmon scattering peak to have larger scattering intensity ratios $S_1/S_0$.

The metal-based particle assembly of the present invention preferably has metal-based particles insulated from each other, that is, it is non-conductive between adjacent metal-based particles (or the metal-based particle assembly (film) is non-conductive). If some or all of the metal-based particles can pass/receive electrons to/from each other, the prescribed light scattering characteristic is weakened, and as a result, it is difficult to obtain a plasmon resonance sufficiently effectively increased in intensity and having an effect over a sufficiently effectively extended range. Accordingly, it is preferable that the metal-based particles be surely separated and have no conductive substance interposed therebetween.

It is preferable that a substrate that is used for the metal-based particle assembly film-layered substrate of the present invention be a non-conductive substrate to ensure that the metal-based particle assembly film is non-conductive. The non-conductive substrate can be made of glass, a variety of inorganic insulating materials ($SiO_2$, $ZrO_2$, mica, and the like), and a variety of plastic materials. In particular, a translucent substrate is preferable, and an optically transparent substrate is more preferable, as, for example, a light emitting device with the substrate applied thereto allows light to be extracted from a surface of the substrate opposite to that having the metal-based particle assembly film layered thereon.

The metal-based particle assembly film-layered substrate preferably further includes an insulating layer covering a surface of the metal-based particle assembly film, more specifically a surface of each metal-based particle. Note that the insulating layer may cover each metal-based particle's surface partially or entirely. Such an insulating layer is preferable not only in ensuring that the metal-based particle assembly film is non-conductive (between the metal-based particles), as described above, but also in applying the substrate to an optical device. More specifically, while an optical device such as electrical energy-driven light emitting device has each constituent layer with a current passing therethrough, the metal-based particle assembly film with a current passing therethrough may result in failing to provide a sufficient emission enhancement effect via plasmon resonance. When the metal-based particle assembly film that is capped by the insulating layer is applied to the optical device, the optical device can have the metal-based particle assembly film electrically insulated from an adjacent constituent layer of the optical device and thus have the metal-based particle assembly film without a current injected into the metal-based particles that compose the metal-based particle assembly film.

The insulating layer is made of any material that is not specially restricted as long as having satisfactory insulation, and it can be formed for example of spin on glass (SOG; containing organic siloxane material for example) and in addition thereto $SiO_2$, $Si_3N_4$ or the like. While the insulating layer is of any thickness that is not restricted as long as ensuring desired insulation, it is better that the insulating layer is smaller in thickness in a range ensuring desired insulation as it is preferable that an active layer when applied to an optical device (e.g., a light emitting layer for a light emitting device, a light-absorbing layer for a photoelectric conversion device, or the like) and the metal-based particle assembly film be closer in distance, as will be described later.

The metal-based particle assembly and metal-based particle assembly film-layered substrate of the present invention are significantly useful as an enhancement element for an optical device such as a light emitting device, a photoelectric conversion device (a solar cell device) or the like, and allow an optical device therewith to provide significant improvements of luminous efficiency, conversion efficiency and/or the like. As described above, the metal-based particle assembly and metal-based particle assembly film-layered substrate of the present invention present significantly intense plasmon resonance, and furthermore, allow the plasmon resonance to have an effect over a significantly extended range, and thus allow an active layer having a thickness for example of 10 nm or larger, furthermore, 20 nm or larger, and still furthermore, larger than that, to be enhanced entirely. Furthermore, as has been set forth above, they also allow an active layer disposed at a position for example 10 nm, further several tens nm (e.g., 20 nm), still further several hundreds nm or larger away to be also significantly effectively enhanced.

Note that there is a tendency that, for its nature, the plasmonic enhancement effect decreases as the distance between the active layer and the metal-based particle assembly increases, so it is preferable that the distance be smaller. The active layer and the metal-based particle assembly have a distance therebetween preferably of 100 nm or smaller, more preferably 20 nm or smaller, and still more preferably 10 nm or smaller.

To more effectively obtain an enhancement effect through plasmon resonance, it is preferable that a maximum wavelength A of at least one peak in an emission spectrum that an active layer (for example serving as a light emitting layer of a light emitting device) presents or an absorption spectrum that an active layer (for example serving as a light absorbing layer of a photoelectric conversion device) presents be maximally close to a maximum wavelength B in a scattering spectrum that the metal-based particle assembly presents (i.e., a maximum wavelength of a peak having a highest peak intensity in an ultraviolet-visible light region, or a plasmon scattering peak), and it is more preferable that they match or substantially match to each other. More specifically, maximum wavelengths A and B preferably have a difference in absolute value of 200 nm or smaller, more preferably 100 nm or smaller, still more preferably 50 nm or smaller, and still more preferably 20 nm or smaller.

When the active layer presents an emission spectrum or an absorption spectrum having a plurality of peaks, any peak may be selected as a peak having maximum wavelength A, although normally a peak that plays a main role for the active layer's function (for example, a peak including a target emission wavelength for a light emitting layer) is selected, and a peak that plays a secondary role may be selected depending on the purpose (for example when light to be emitted is adjusted in color as targeted).

As described above, maximum wavelengths A and B can have a difference in absolute value controlled by adjusting the metal-based particle in average particle diameter and/or average interparticle distance to adjust the plasmon scattering peak's maximum wavelength B.

The light emitting layer that is an active layer of a light emitting device can for example be that formed of 1) monomolecular film including dye molecules disposed in a plane, 2) a matrix doped with dye molecules, 3) a luminescent small molecule, 4) a luminescent polymer, or the like.

Light emitting layer 1) can be obtained by applying a dye molecule-containing liquid with spin-coating, and subsequently removing a solvent. The dye molecule specifically includes by way of example rhodamine-based dyes such as rhodamine 101, rhodamine 110, rhodamine 560, rhodamine 6G, rhodamine B, rhodamine 640, and rhodamine 700 sold by Exciton, a coumarin-based dye such as coumarin 503 sold by Exciton, and the like.

Light emitting layer 2) can be obtained by applying a dye molecule and matrix material-containing liquid with spin-coating, and subsequently removing a solvent. The matrix material can be a transparent polymer such as polyvinyl alcohol and polymethyl methacrylate. The dye molecule can be similar to that of light emitting layer 1).

Light emitting layer 3) can be obtained through dry or wet deposition including spin-coating, vapor deposition or the like. The luminescent small molecule is specifically exemplified by tris (8-quinolinolato) aluminum complex [tris (8-hydroxyquinoline) aluminum complex; $Alq_3$], bis(benzoquinolinolato)beryllium complex [BeBq], and the like.

Light emitting layer 4) can be obtained by a wet deposition using a luminescent polymer containing liquid such as spin-coating. The luminescent polymer is specifically exemplified by a π-conjugated polymer such as F8BT [poly(9,9-dioctylfluorene-alt-benzothiadiazole)], poly(p-phenylenevinylene), and polyalkylthiophene.

<Method for Producing Metal-Based Particle Assembly and Metal-Based Particle Assembly Film-Layered Substrate>

The metal-based particle assembly and metal-based particle assembly film-layered substrate of the present invention can be produced for example in such a method as follows:

(1) a bottom-up method to grow metal-based particles from minute seeds on a substrate;

(2) a method in which a metal-based particle that has a prescribed shape is covered with a protection layer made of an amphiphilic material and having a prescribed thickness, and the resultant is then subjected to langmuir blodgett (LB) deposition to be formed in a film on a substrate; and (3) other methods, such as a method of post-treating (e.g., applying heat to treat) a thin film obtained by wet deposition using a metal nanoparticle-containing dispersion or dry deposition such as vapor deposition, sputtering or the like; subjecting a thin film to resist-processing and/or etching the thin film; a casting method using a liquid having metal-based particles dispersed therein, and the like.

It is important that method (1) includes the step of growing a metal-based particle at a significantly low speed on a substrate adjusted to have a prescribed temperature (hereinafter also referred to as the particle growth step). A production method including the particle growth step can provide a satisfactorily controlled thin film of a metal-based particle assembly having 30 or more metal-based particles mutually separated and thus disposed in two dimensions, and having a prescribed shape (having an average particle diameter of 200 to 1600 nm, an average height of 55 to 500 nm, and an aspect ratio of 1 to 8), and furthermore, a prescribed light scattering characteristic.

In the particle growth step, the metal-based particle is grown on the substrate preferably at an average height growth rate smaller than 1 nm/minute, more preferably 0.5 nm/minute or smaller. The average height growth rate as referred to herein can also be referred to as an average deposition rate or the metal-based particle's average thickness growth rate, and is defined by the following expression:

metal-based particle's average height/metal-based particle growth time (or metal-based material supply time).

The "metal-based particle's average height" is defined as has been set forth above.

In the particle growth step, the substrate is set in temperature preferably within a range of 100-450° C., more preferably 200-450° C., still more preferably 250-350° C., and particularly still more preferably 300° C. or thereabound (300° C.±approximately 10° C.).

When the production method includes the particle growth step to grow metal-based particles at an average height growth rate smaller than 1 nm/minute on a substrate adjusted in temperature within the range of 100-450° C., the particles are initially grown such that a supplied metal-based material forms a plurality of island structures, and as the metal-based material is further supplied the island structures are further grown and thus merged with neighboring island structures, and consequently, metal-based particles having a relatively large average particle diameter are closely disposed while the metal-based particles are each completely separated from each other to form a metal-based particle assembly layer.

Furthermore, the average height growth rate, the substrate's temperature and/or the metal-based particle growth time (or metal-based material supply time) can be adjusted to control within a prescribed range the average particle diameter, average height, aspect ratio, and/or average interparticle distance of the metal-based particles grown on the substrate.

Furthermore, the production method including the particle growth step allows the particle growth step to be performed such that conditions other than the substrate's temperature and the average height growth rate are selected relatively freely, and the method thus advantageously allows a metal-based particle assembly film of a desired size to be efficiently formed on a substrate of a desired size.

If the average height growth rate is 1 nm/minute or larger, or the substrate has a temperature lower than 100° C. or higher than 450° C., then before the island structure is grown to be large the island structure forms a continuum with a neighboring island structure and a metal-based assembly formed of metal-based particles mutually completely separated and having a large particle diameter cannot be obtained or a metal-based assembly formed of metal-based particles having a desired shape cannot be obtained (for example, it would depart in average height, average interparticle distance, and aspect ratio from a desired range).

While the metal-based particles are grown under a pressure (in an apparatus's chamber), which may be any pressure that allows the particles to be grown, it is normally lower than atmospheric pressure. While the pressure's lower limit is not limited to a specific value, it is preferably 6 Pa or larger, more preferably 10 Pa or larger, still more preferably 30 Pa or larger, as such pressure helps to adjust the average height growth rate to fall within the range indicated above.

The metal-based particles can specifically be grown on a substrate in any method allowing the particles to be grown at an average height growth rate smaller than 1 nm/minute, and the method can include sputtering, and vapor deposition such as vacuum deposition. Preferable sputtering is direct current (DC) sputtering as it allows the metal-based particle assembly to be grown relatively conveniently and also facilitates maintaining the average height growth rate smaller than 1 nm/minute. The sputtering may be done in any system and it can for example be direct current argon ion sputtering to expose a target to argon ions generated by a plasma discharge, an ion gun or the like and accelerated in an electric field. The sputtering is done with a current value, a voltage value, a substrate-to-target distance and other conditions adjusted as appropriate to grow particles at the average height growth rate smaller than 1 nm/minute.

Note that to obtain a satisfactorily controlled metal-based particle assembly having metal-based particles of a prescribed shape (in average particle diameter, average height, and aspect ratio) and furthermore, having a prescribed light scattering characteristic, it is preferable that the particle growth step be performed at the average height growth rate smaller than 1 nm/minute and in addition thereto an average particle diameter growth rate smaller than 5 nm, and when the average height growth rate is smaller than 1 nm/minute, the average particle diameter growth rate is normally smaller than 5 nm. The average particle diameter growth rate is more preferably 1 nm/minute or slower. The average particle diameter growth rate is defined by the following expression:

metal-based particle's average particle diameter/metal-based particle growth time (or metal-based material supply time).

The "metal-based particle's average particle diameter" is defined as has been set forth above.

The metal-based particle growth time (or metal-based material supply time) in the particle growth step is a period of time that at least allows metal-based particles carried on a substrate to attain a prescribed shape and still preferably a desirable average interparticle distance and that is smaller than a period of time allowing the particles to depart from the prescribed shape and the average interparticle distance. For example, even if particle growth is performed at an average height growth rate and substrate temperature within the above prescribed ranges, an extremely long period of time for growth results in a metal-based material carried in an excessively large amount and accordingly it will not form an assembly of mutually separated metal-based particles and instead form a continuous film or be metal-based particles excessively large in average particle diameter or average height.

Accordingly it is necessary to grow metal-based particles for an appropriately set period of time (or to stop the particle growth step at an appropriate time), and such time can be set based for example on a relationship between an average height growth rate and a substrate's temperature and a shape and average interparticle distance of metal-based particles of a metal-based particle assembly obtained, as previously obtained through an experiment. Alternatively a time elapsing before a thin film of a metal-based material grown on a substrate exhibits conduction, that is, a time allowing the thin film to be a continuous film rather than a metal-based particle assembly film, may previously be obtained through an experiment and the particle growth step may be stopped before that time is reached.

The metal-based particles are grown on a substrate preferably having as smooth a surface as possible and, inter alia, more preferably a surface that is smooth at the atomic level. When the substrate has a smoother surface, thermal energy received from the substrate helps a growing metal-based particle to merge with a surrounding, adjacent metal-based particle and thus grow, and thus there is a tendency to facilitate providing a film formed of metal-based particles of a larger size.

EXAMPLES

Hereinafter, examples will be described to more specifically describe the present invention, although the present invention is not limited thereto.

[Producing Metal-Based Particle Assembly and Metal-Based Particle Assembly Film-Layered Substrate]

Inventive Example 1

A direct-current magnetron sputtering apparatus was used to grow silver particles significantly slowly on a soda glass substrate to form a thin film of a metal-based particle assembly on the entire surface of the substrate to produce a metal-based particle assembly film-layered substrate under the following conditions:

gas used: argon;
pressure in chamber (sputtering-gas pressure): 10 Pa;
substrate-to-target distance: 100 mm;
sputtering power: 4 W;
average particle diameter growth rate (average particle diameter/sputtering time): 0.9 nm/minute;
average height growth rate (=average deposition rate=average height/sputtering time): 0.25 nm/minute;
substrate's temperature: 300° C.; and
substrate's size and shape: a square with each side having a length of 5 cm.

Figure 2:
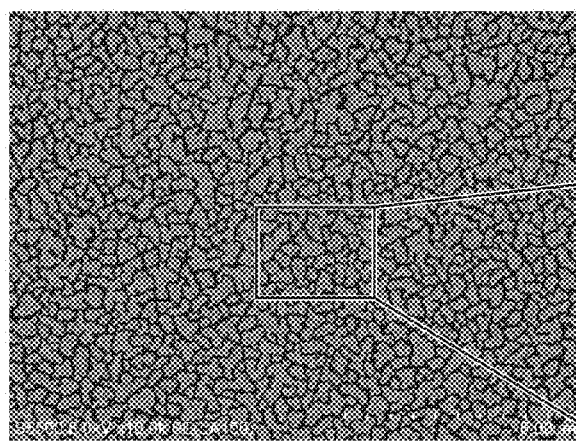
FIGS. 2A and 2B show SEM images (as scaled 10000 times and 50000 times) of a metal-based particle assembly film in a metal-based particle assembly film-layered substrate obtained in Inventive Example 1, as observed from directly above.
Figure 2B:
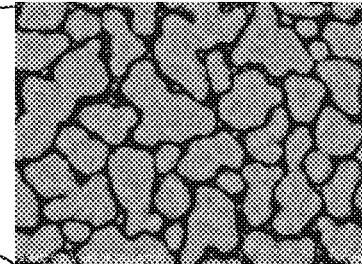
Figure 3:
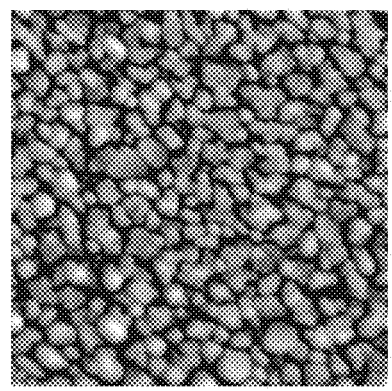
FIG. 3 shows an AFM image of the metal-based particle assembly film in the metal-based particle assembly film-layered substrate obtained in Inventive Example 1.

FIGS. 2A and 2B show SEM images of a metal-based particle assembly film in the obtained metal-based particle assembly film-layered substrate, as observed from directly above. FIG. 2A shows an image enlarged as scaled 10000 times and FIG. 2B shows an image enlarged as scaled 50000 times. FIG. 3 shows an AFM image of the metal-based particle assembly film in the metal-based particle assembly film-layered substrate obtained. The AFM image was obtained via "VN-8010" produced by KEYENCE CORPORATION (this is also applied hereinafter). FIG. 3 shows an image having a size of 5 μm×5 μm.

A calculation with reference to the FIGS. 2A and 2B SEM images indicates that Inventive Example 1 provided a metal-based particle assembly configured of silver particles having an average particle diameter of 335 nm and an average interparticle distance of 16.7 nm, based on the definition indicated above. Furthermore, from the FIGS. 2A and 2B AFM image, an average height of 96.2 nm was obtained. From these values the silver particle's aspect ratio (average particle diameter/average height) was calculated to be 3.48 and it can also be found from the obtained images that the silver particles have an oblate shape. Furthermore, it can be seen from the SEM images that the metal-based particle assembly of Inventive Example 1 has approximately $6.25 \times 10^{10}$ silver particles (approximately 25 particles/$\mu m^2$).

Furthermore, the obtained metal-based particle assembly film-layered substrate had the metal-based particle assembly film connected at a surface to a tester [multimeter "E2378A"

produced by Hewlett Packard Co.] to confirm conduction, and it has been found to be non-conductive.

Comparative Examples 1 and 2

The direct-current magnetron sputtering was done with a varied deposition time to produce metal-based particle assembly film-layered substrates for Comparative Examples 1 and 2. The metal-based particle assembly film-layered substrate of Comparative Example 1 had metal-based particles having substantially the same shape, aspect ratio and average interparticle distance as Inventive Example 1 except that the metal-based particles had an average height of approximately 10 nm, and the metal-based particle assembly film-layered substrate of Comparative Example 2 had metal-based particles having substantially the same shape, aspect ratio and average interparticle distance as Inventive Example 1 except that the metal-based particles had an average height of approximately 30 nm.

[Measuring Scattering Intensity Ratio $S_1/S_0$]

Figure 4:
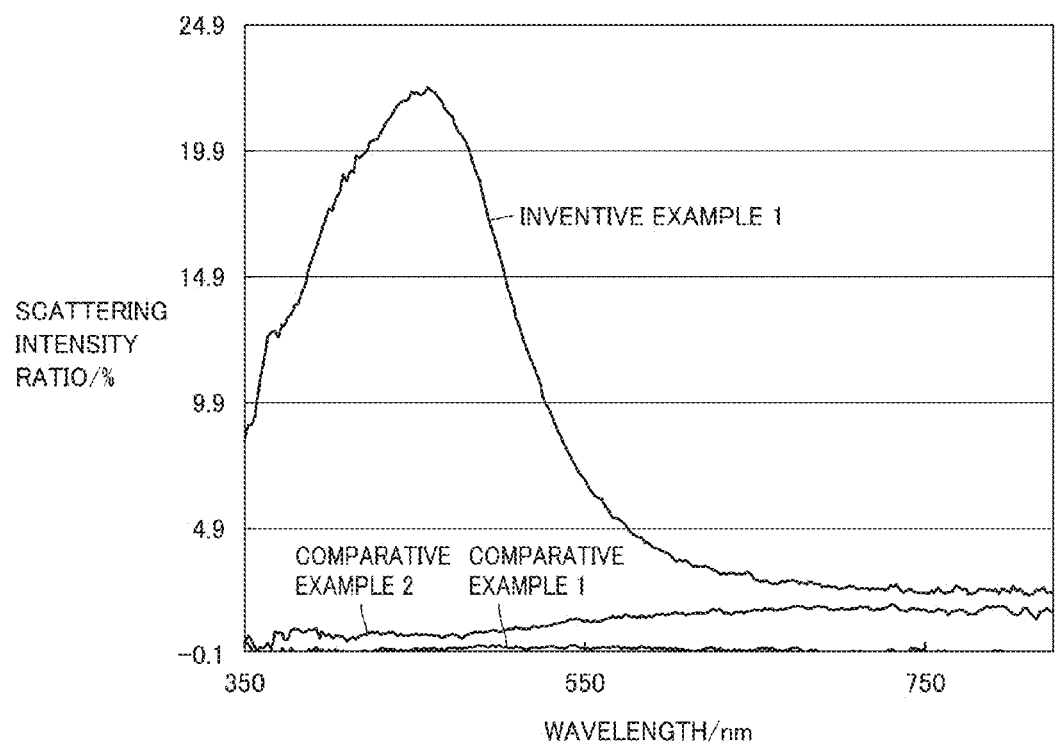
FIG. 4 represents a relationship of a scattering intensity ratio versus wavelength of scattered light, as obtained via the metal-based particle assembly film-layered substrates of Inventive Example 1 and Comparative Examples 1 and 2.

FIG. 4 represents a relationship of a scattering intensity ratio versus wavelength of scattered light, as obtained via the metal-based particle assembly film-layered substrates of Inventive Example 1 and Comparative Examples 1 and 2. The FIG. 4 graph has an axis of ordinate representing scattering intensity ratio $S_1/S_0$ obtained in the above described measurement method, as represented in percentages. As shown in FIG. 4, Inventive Example 1, Comparative Example 1, and Comparative Example 2 provide plasmon scattering peaks having scattering intensity ratios S1/S0 of 22.4% (maximum wavelength: 458 nm), 0.1% (maximum wavelength: 652 nm), and 1.9% (maximum wavelength: 730 nm), respectively. Thus the metal-based particle assembly film-layered substrates of Comparative Examples 1 and 2 did not have a substantial plasmon scattering peak.

Scattering intensity ratio $S_1/S_0$ was measured as follows: a spectroscopic instrument (a spectrophotometer for ultraviolet and visible region V-650 produced by Jasco Corporation) was employed, and white light was used as incident light to obtain a scattering spectrum of light scattered at an angle of 30° from that incident light. Note that the following inventive and comparative examples' scattering spectra and scattering intensity ratios $S_1/S_0$ were also measured in the same manner.

As the reference system's layered substrate was used a standard diffusion plate that was implemented as a soda glass substrate having powdery barium sulfate set flat thereon as a barium sulfate layer.

[Measuring Absorption Spectrum]

Figure 5:
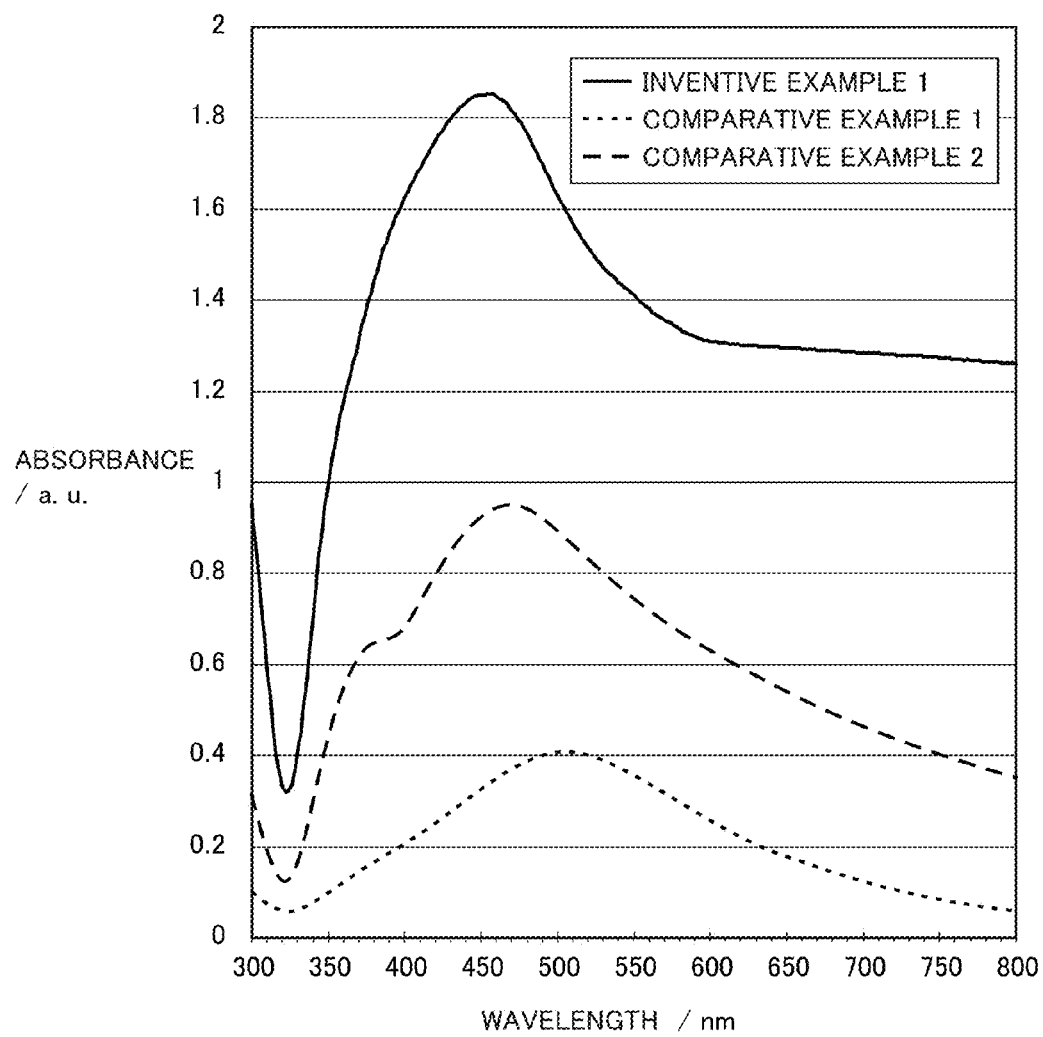
FIG. 5 represents absorption spectra of the metal-based particle assembly film-layered substrates obtained in Inventive Example 1 and Comparative Examples 1 and 2.

FIG. 5 represents absorption spectra, as measured through absorptiometry, of the metal-based particle assembly film-layered substrates obtained in Inventive Example 1 and Comparative Examples 1 and 2. As indicated in a nonpatent document (K. Lance Kelly, et al., "The Optical Properties of Metal Nanoparticles: The Influence of Size, Shape, and Dielectric Environment", The Journal of Physical Chemistry B, 2003, 107, 668), an oblate silver particle as produced in Inventive Example 1 alone typically has a plasmon peak around 550 nm and 650 nm for average particle diameters of 200 nm and 300 nm, respectively.

In contrast, it can be seen that Inventive Example 1's metal-based particle assembly film-layered substrate, despite its constituent silver particles having an average particle diameter of approximately 300 nm (335 nm), presents for a visible light region a maximum wavelength of a plasmon peak at a longest side in wavelength, and the maximum wavelength is around approximately 450 nm, or shifted to a shorter side in wavelength. Furthermore, the plasmon peak's maximum wavelength depends on the metal-based particles' average particle diameter. Comparative Examples 1 and 2 have small average particle diameters, and accordingly have a plasmon peak at a side considerably longer in wavelength than Inventive Example 1, with maximum wavelengths of approximately 510 nm and approximately 470 nm, respectively.

Note that the absorption spectrum is obtained as follows: a metal-based particle assembly film-layered substrate is exposed to light of the ultraviolet to visible light region incident on a back surface thereof (i.e., a side facing away from the metal-based particle assembly film) in a direction perpendicular to a substrate surface and intensity I of transmitted light omnidirectionally transmitted toward the metal-based particle assembly film is measured with an integrating sphere spectrophotometer. On the other hand, a substrate which does not have a metal-based particle assembly film and has the same thickness and the same material as the substrate of said metal-based particle assembly film-layered substrate is exposed at a surface thereof to the same incident light as above in a direction perpendicular to that surface and intensity $I_0$ of transmitted light omnidirectionally transmitted through a side opposite to the incident surface is measured with the integrating sphere spectrophotometer. The axis of ordinate represents absorbance, which is represented by the following expression:

Absorbance=$-\log_{10}(I/I_0)$.

[Producing Photoexcited Light Emitting Device and Assessing Emission Enhancement]

Inventive Example 2-1

Silver particles were grown under substantially the same conditions as Inventive Example 1 to provide on a 0.5 mm thick soda glass substrate a metal-based particle assembly film similar to that of Inventive Example 1. The metal-based particle assembly film had metal-based particles having the same shape (average particle diameter: approximately 330 nm; and aspect ratio: approximately 3.5) and average interparticle distance as Inventive Example 1 except that the metal-based particles had an average height of 66.1 nm.

Figure 6:
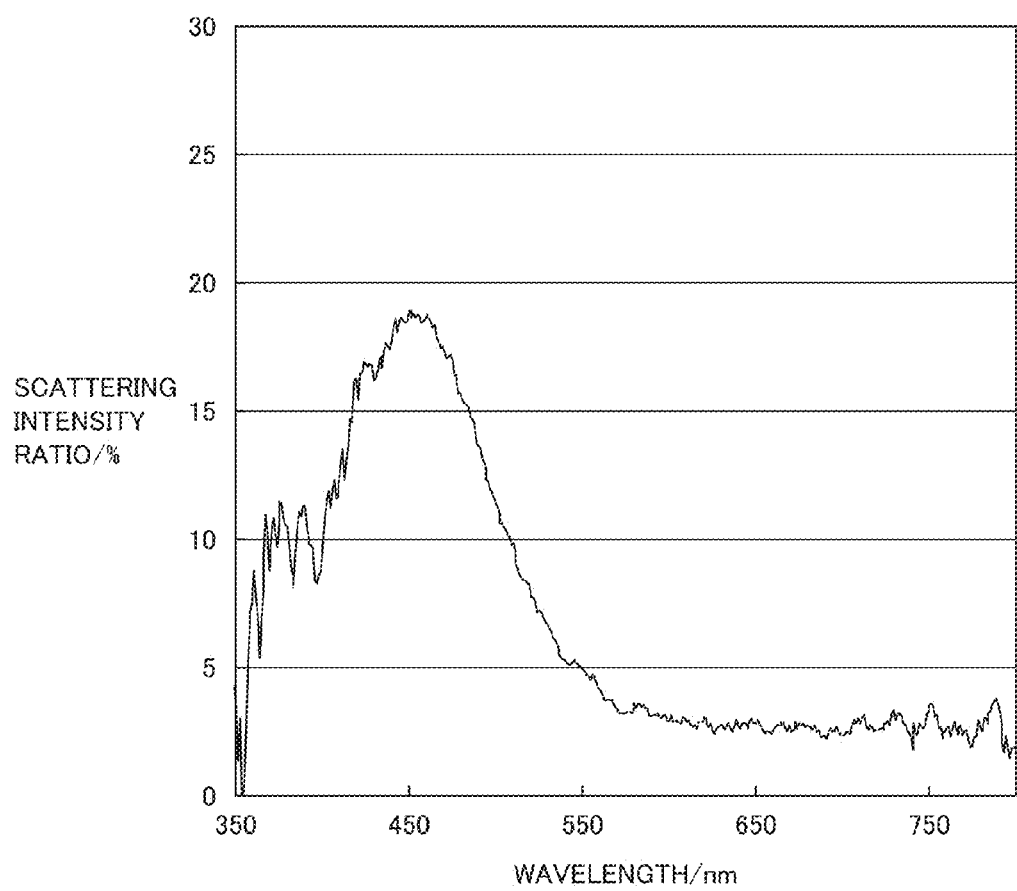
FIG. 6 represents a relationship of a scattering intensity ratio versus wavelength of scattered light, as obtained via a metal-based particle assembly film-layered substrate of Inventive Example 2-1.

FIG. 6 represents a relationship of a scattering intensity ratio versus scattered light in wavelength, as obtained via the metal-based particle assembly film-layered substrate of Inventive Example 2-1. As shown in FIG. 6, a plasmon scattering peak was presented with a scattering intensity ratio $S_1/S_0$ of 19.0% (maximum wavelength: 451 nm).

Then a solution for a coumarin-based light emitting layer was applied with spin-coating on the metal-based particle assembly film at 3000 rpm to provide a significantly thin coumarin-based light emitting layer (on the scale of monomolecular film) to thus obtain a light emitting device. The solution for the coumarin-based light emitting layer was prepared as follows. Initially, a coumarin dye (Coumarin 503 from Exciton) was dissolved in ethanol to obtain a 5 mM coumarin solution. Separately, an organic SOG material ("OCD T-7 5500T" produced by TOKYO OHKA KOGYO CO., LTD.) was diluted with ethanol to be 33% by volume. The organic SOG material diluted to be 33% by volume, the 5 mM coumarin solution, and ethanol were mixed together to have a volumetric ratio of 1:5:5 to obtain the solution for the coumarin-based light emitting layer.

Inventive Example 2-2

Silver particles were grown under the same conditions as Inventive Example 2-1 to provide on a 0.5 mm thick soda glass substrate the metal-based particle assembly film described in Inventive Example 2-1. Thereafter immediately a SOG solution was applied with spin-coating on the metal-based particle assembly film to have an insulating layer having an average thickness of 10 nm layered thereon. For the SOG solution was used "OCD T-7 5500T", an organic SOG material produced by TOKYO OHKA KOGYO CO., LTD., which was then diluted with ethanol. "Average thickness" as referred to herein means an average value of thicknesses at any five points, as obtained when the solution is directly applied with spin-coating on the soda glass substrate under the same conditions (i.e., on the same area, with the same composition, and in the same amount) as it is applied on the metal-based particle assembly (this is also applied to the following inventive and comparative examples).

Then the same solution for the coumarin-based light emitting layer as used in Inventive Example 2-1 was applied with spin-coating at 3000 rpm on the outermost surface of the metal-based particle assembly film having the insulating layer to provide a significantly thin coumarin-based light emitting layer (on the scale of monomolecular film) to thus obtain a light emitting device.

Inventive Example 2-3

A light emitting device was produced similarly as done in Inventive Example 2-2 except that the insulating layer had an average thickness of 30 nm.

Inventive Example 2-4

A light emitting device was produced similarly as done in Inventive Example 2-2 except that the insulating layer had an average thickness of 80 nm.

Inventive Example 2-5

A light emitting device was produced similarly as done in Inventive Example 2-2 except that the insulating layer had an average thickness of 150 nm.

Inventive Example 2-6

A light emitting device was produced similarly as done in Inventive Example 2-2 except that the insulating layer had an average thickness of 350 nm.

Inventive Example 3-1

A silver nanoparticle dispersion (silver nanocolloid A-2, a reflective film forming ink produced by Mitsubishi Materials Corporation) was diluted with ethanol to 1/40 to prepare a silver nanoparticle coating liquid.

Then, 100 µL of the silver nanoparticle coating liquid was applied with spin-coating at 1000 rpm on a 1 mm thick soda glass substrate having a surface wiped with acetone and thereafter a hot plate of 280° C. was used to apply heat to treat (or anneal) the substrate in an atmosphere of air for 2 minutes. Applying the silver nanoparticle coating liquid with spin-coating and a subsequent heat treatment were repeated as a series of steps 20 times in total to obtain a metal-based particle assembly film-layered substrate.

Figure 7A:
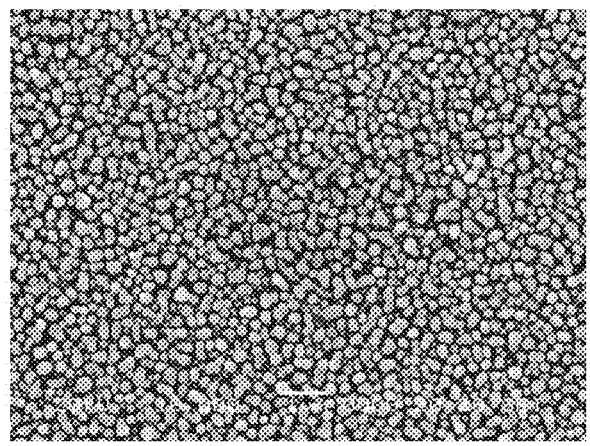
FIGS. 7A and 7B show SEM images (as scaled 10000 times and 50000 times) of a metal-based particle assembly film in a metal-based particle assembly film-layered substrate obtained in Inventive Example 3-1, as observed from directly above.
Figure 7B:
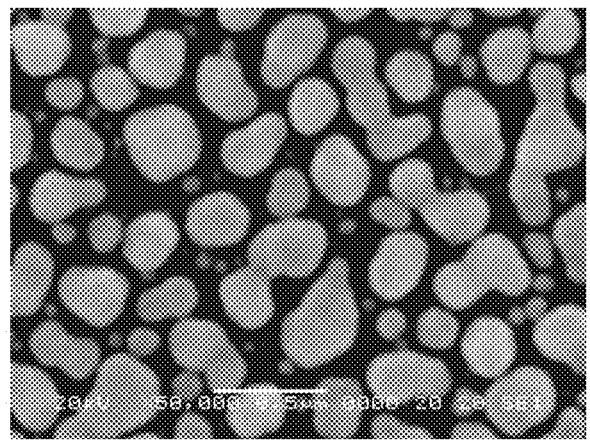
Figure 8:
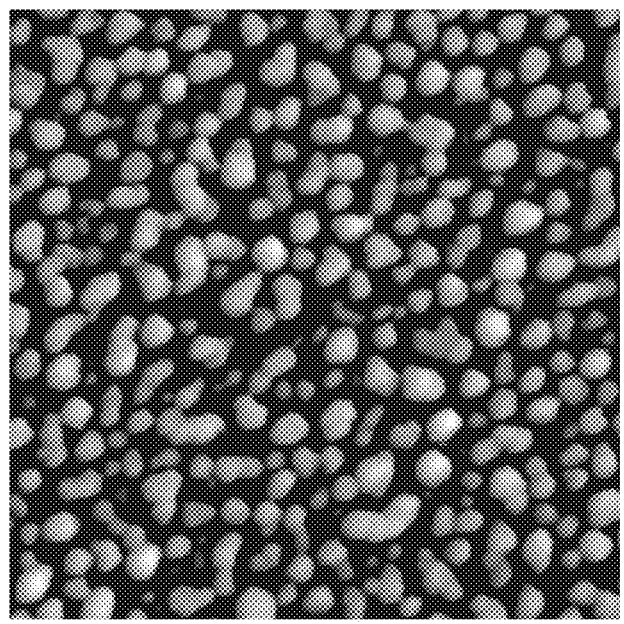
FIG. 8 shows an AFM image of the metal-based particle assembly film in the metal-based particle assembly film-layered substrate obtained in Inventive Example 3-1.

FIGS. 7A and 7B show SEM images of a metal-based particle assembly film in the obtained metal-based particle assembly film-layered substrate, as observed from directly above. FIG. 7A shows an image enlarged as scaled 10000 times and FIG. 7B shows an image enlarged as scaled 50000 times. FIG. 8 shows an AFM image of the metal-based particle assembly film in the metal-based particle assembly film-layered substrate obtained. FIG. 8 shows an image having a size of 5 µm×5 µm.

Figure 9:
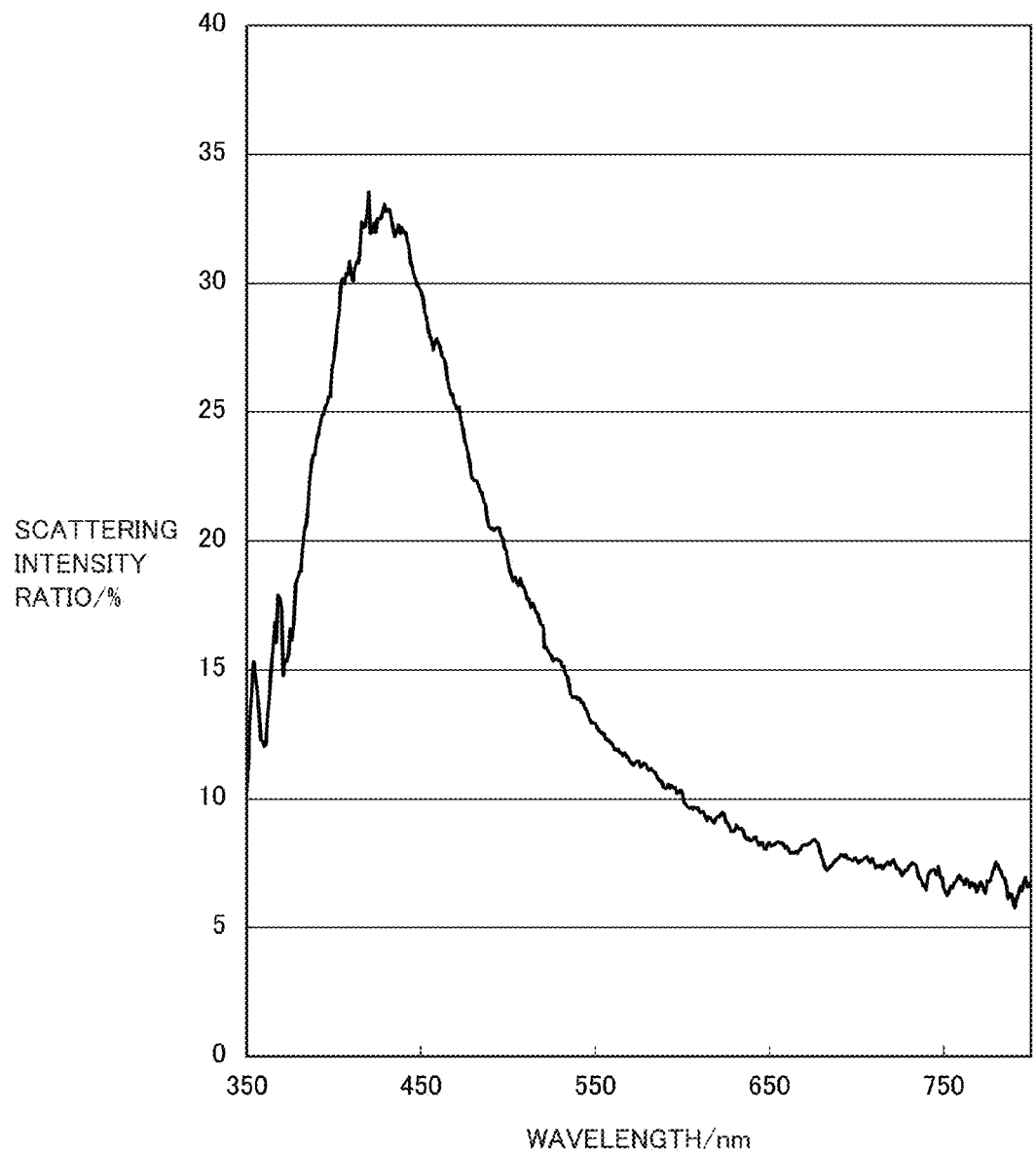
FIG. 9 represents a relationship of a scattering intensity ratio versus wavelength of scattered light, as obtained via the metal-based particle assembly film-layered substrate of Inventive Example 3-1.
Figure 10:
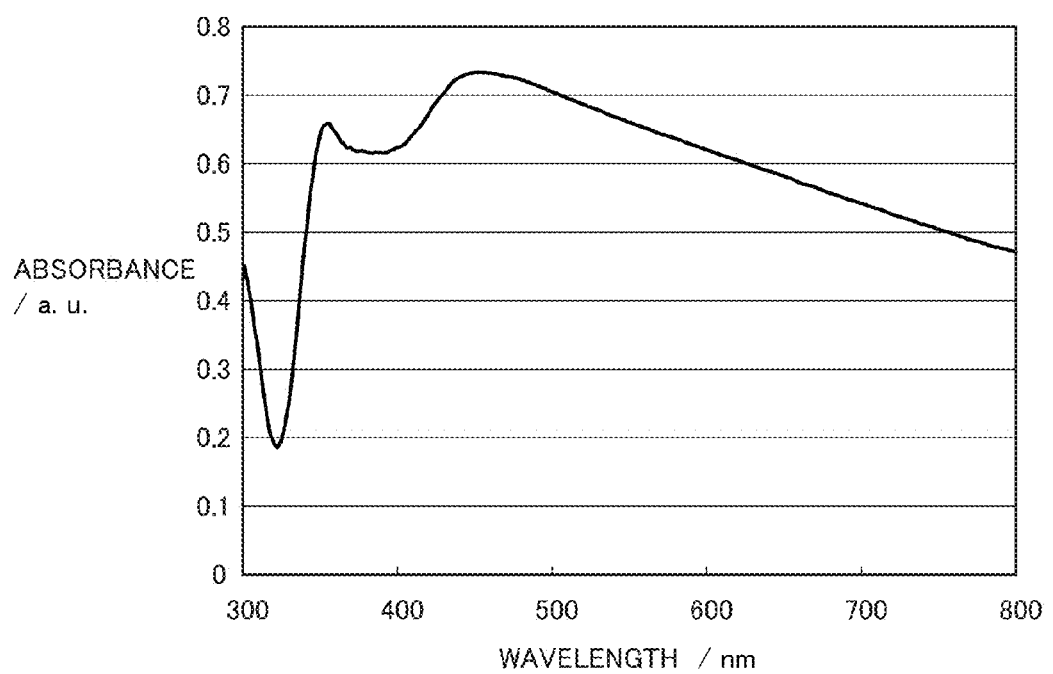
FIG. 10 represents an absorption spectrum of the metal-based particle assembly film-layered substrate obtained in Inventive Example 3-1.

FIG. 9 represents a relationship of a scattering intensity ratio versus wavelength of scattered light, as obtained via the metal-based particle assembly film-layered substrate of Inventive Example 3-1. As shown in FIG. 9, a plasmon scattering peak was presented with a scattering intensity ratio $S_1/S_0$ of 33.5% (maximum wavelength: 420 nm). Furthermore, FIG. 10 shows an absorption spectrum of the metal-based particle assembly film-layered substrate obtained in Inventive Example 3-1, as measured as described above.

A calculation with reference to the FIGS. 7A and 7B SEM images indicates that Inventive Example 3-1 provided a metal-based particle assembly configured of silver particles having an average particle diameter of 323 nm and an average interparticle distance of 63.0 nm, based on the definition indicated above. Furthermore, from the FIG. 8 AFM image, an average height of 94.6 nm was obtained. From these values the silver particle's aspect ratio (average particle diameter/average height) was calculated to be 3.41 and it can also be found from the obtained images that the silver particles have an oblate shape. Furthermore, it can be seen from the SEM images that the metal-based particle assembly of Inventive Example 3-1 has approximately $21 \times 10^{10}$ silver particles (approximately 5.3 particles/µm$^2$).

Furthermore, the obtained metal-based particle assembly film-layered substrate had the metal-based particle assembly film connected at a surface to a tester [multimeter "E2378A" produced by Hewlett Packard Co.] to confirm conduction, and it has been found to be non-conductive.

While Inventive Example 3-1 presents an absorption spectrum (see FIG. 10) with a peak that is located at a longest side in wavelength, i.e., a plasmon peak, lower in absorbance than Inventive Example 1 (see FIG. 5), Inventive Example 3-1 presents a plasmon scattering peak with a relatively high scattering intensity ratio, as shown in FIG. 9. This is partially because the heat treatment's temperature was set low to slightly distort the metal-based particles' shape (see the FIGS. 7A and 7B SEM images and the FIG. 8 AFM image).

Note that Inventive Example 3-1 presents an absorption spectrum (see FIG. 10) lower in absorbance throughout the visible light wavelength range than Inventive Example 1 (see FIG. 5). This means that Inventive Example 3-1 provides a metal-based particle assembly film-layered substrate superior to Inventive Example 1 in optical transparency. Such a metal-based particle assembly film-layered substrate excellent in optical transparency can be applied to an optical device with less impaired optical transparency, and the substrate is suitably applied to an optical device such as a transparent display and the like in particular.

Except that the metal-based particle assembly film-layered substrate obtained in Inventive Example 3-1 was used, a manner similar to Inventive Example 2-2 was employed to provide an insulating layer having an average thickness of 10 nm and a coumarin-based light emitting layer to produce a light emitting device.

Inventive Examples 3-2 to 3-4

Except that the metal-based particle assembly film-layered substrate obtained in Inventive Example 3-1 was used, manners similar to Inventive Examples 2-3 to 2-5 were employed to provide insulating layers of 30 nm, 80 nm and 150 nm, respectively, in average thickness and a coumarin-based light emitting layer to produce light emitting devices.

Comparative Example 3-1

An aqueous silver nanoparticle dispersion (produced by Mitsubishi Paper Mills, Ltd., silver nanoparticle concentration: 25% by weight; and silver nanoparticle's average particle diameter: 15 nm) was diluted with pure water to have a silver nanoparticle concentration of 6% by weight. Then to the aqueous silver nanoparticle dispersion 1% by volume of a surfactant was added and sufficiently agitated and thereafter to the obtained aqueous silver nanoparticle dispersion 80% by volume of acetone was added and sufficiently agitated at ordinary temperature to prepare a silver nanoparticle coating liquid.

Then, the silver nanoparticle coating liquid was applied with spin-coating at 1500 rpm on a 1 mm thick soda glass substrate having a surface wiped with acetone and thereafter the substrate was left as it was in the air for 1 minute. Then the soda glass substrate with a silver film deposited thereon was introduced in an electric furnace of 550° C. and thus underwent a heat treatment (or was annealed) in an atmosphere of air for 5 minutes to obtain a metal-based particle assembly film-layered substrate.

Figure 11:
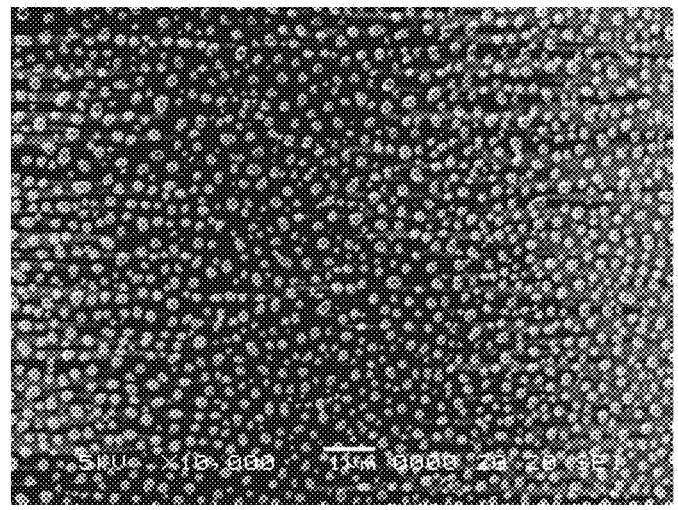
FIG. 11 shows an SEM image (as scaled 10000 times) of a metal-based particle assembly film in a metal-based particle assembly film-layered substrate obtained in Comparative Example 3-1, as observed from directly above.
Figure 12:
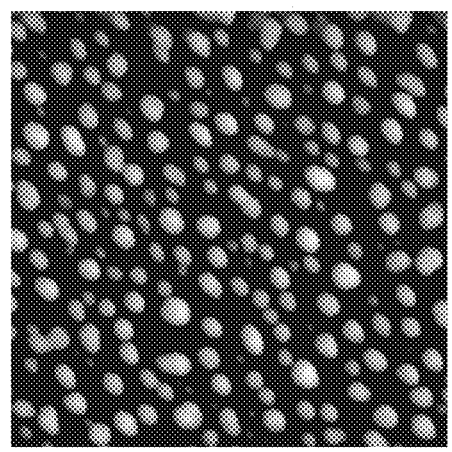
FIG. 12 shows an AFM image of the metal-based particle assembly film in the metal-based particle assembly film-layered substrate obtained in Comparative Example 3-1.

FIG. 11 shows an SEM image, enlarged as scaled 10000 times, of a metal-based particle assembly film in the metal-based particle assembly film-layered substrate obtained in Comparative Example 3-1, as observed from directly above. FIG. 12 shows an AFM image of the metal-based particle assembly film in the metal-based particle assembly film-layered substrate obtained in Comparative Example 3-1. FIG. 12 shows an image having a size of 5 µm×5 µm.

Figure 13:
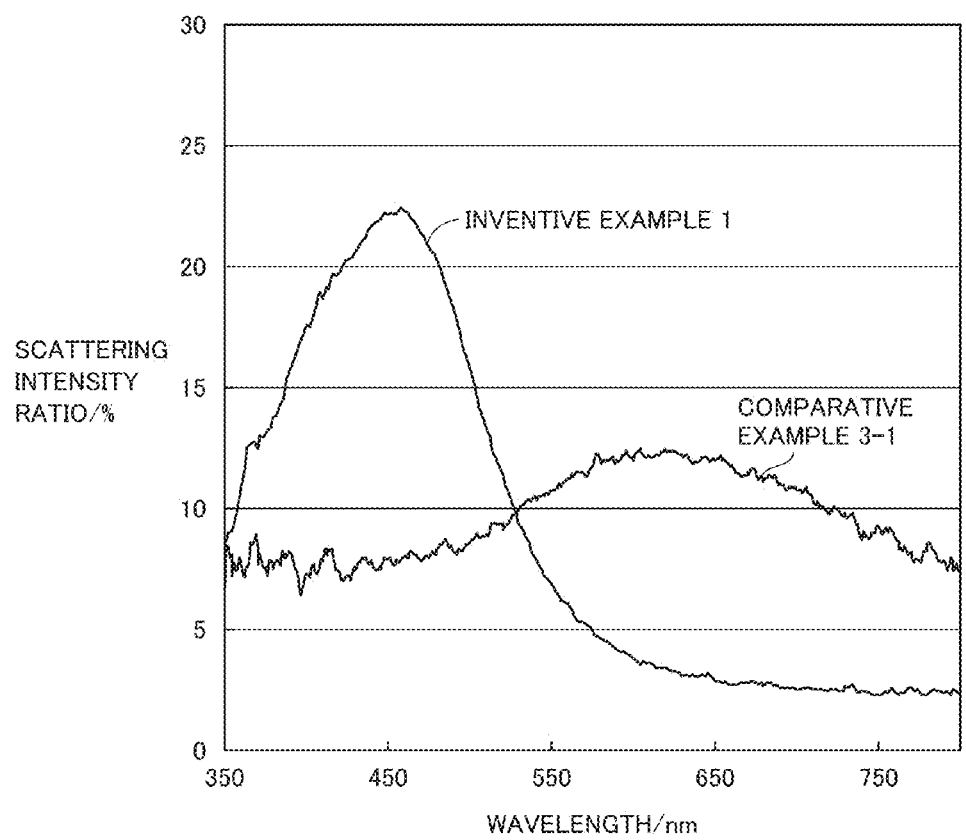
FIG. 13 represents a relationship of a scattering intensity ratio versus wavelength of scattered light, as obtained via the metal-based particle assembly film-layered substrate obtained in Comparative Example 3-1.
Figure 14:
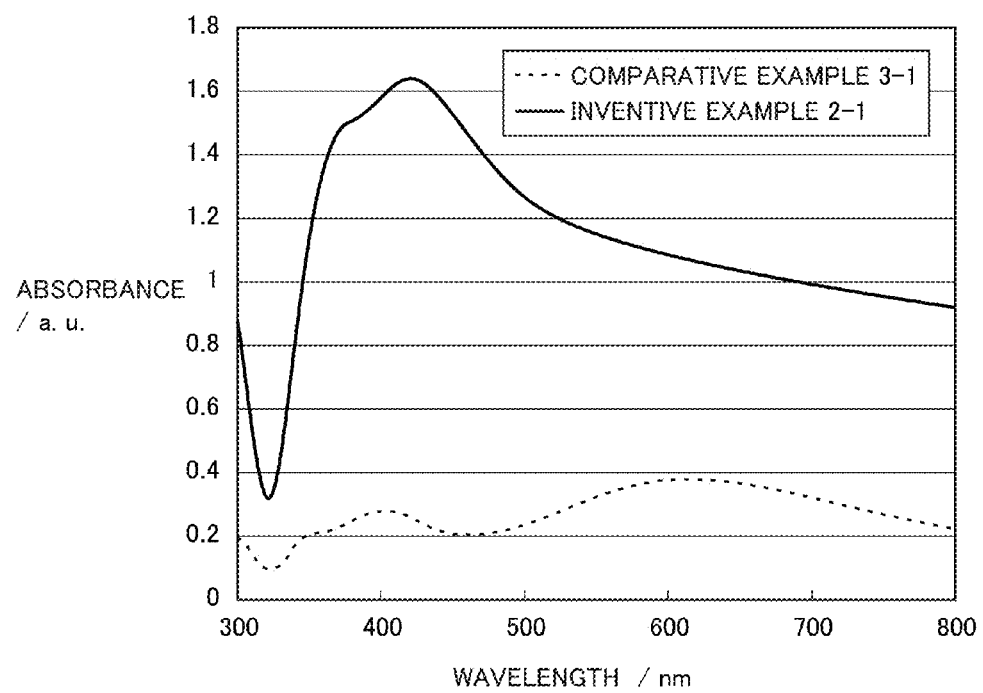
FIG. 14 represents absorption spectra of the metal-based particle assembly film-layered substrates obtained in Inventive Example 2-1 and Comparative Example 3-1.

FIG. 13 represents a relationship of a scattering intensity ratio versus wavelength of scattered light, as obtained via the metal-based particle assembly film-layered substrate obtained in Comparative Example 3-1. For comparison, FIG. 13 also shows the graph of Inventive Example 1 as shown in FIG. 4. FIG. 14 shows absorption spectra of the metal-based particle assembly film-layered substrates obtained in Inventive Example 2-1 and Comparative Example 3-1, as measured as described above.

A calculation with reference to the FIG. 11 SEM image indicates that Comparative Example 3-1 provided a metal-based particle assembly configured of silver particles having an average particle diameter of 278 nm and an average inter-particle distance of 195.5 nm, based on the definition indicated above. Furthermore, from the FIG. 12 AFM image, an average height of 99.5 nm was obtained. From these values the silver particle's aspect ratio (average particle diameter/average height) was calculated to be 2.79 and it can also be found from the obtained images that the silver particles have an oblate shape. Furthermore, it can be seen from the SEM image that the metal-based particle assembly of Comparative Example 3-1 has approximately $2.18 \times 10^{10}$ silver particles (approximately 8.72 particles/µm²).

As shown in FIG. 13, the metal-based particle assembly of Comparative Example 3-1 presented a plasmon scattering peak having a scattering intensity ratio $S_1/S_0$ of 12.5% (maximum wavelength: 619 nm). The metal-based particle assembly of Comparative Example 3-1 provided scattering intensity ratio $S_1/S_0$ different than any of the inventive examples, i.e., smaller than 15%.

It can be found from the FIG. 14 absorption spectrum and the FIG. 10 absorption spectrum that Inventive Examples 2-1 and 3-1 present a plasmon peak at a longest side in wavelength having a maximum wavelength blue-shifted as compared with that of Comparative Example 3-1, and that the plasmon peak is also steep and at its maximum wavelength presents high absorbance.

Then, similarly as done in Inventive Example 2-1, the metal-based particle assembly film was provided thereon with a coumarin-based light emitting layer to obtain a light emitting device.

Comparative Example 3-2

The same method as Comparative Example 3-1 was employed to provide on a 1 mm thick soda glass substrate the metal-based particle assembly film described in Comparative Example 3-1. Thereafter immediately a SOG solution was applied with spin-coating on the metal-based particle assembly film to have an insulating layer having an average thickness of 10 nm layered thereon. For the SOG solution was used "OCD T-7 5500T", an organic SOG material produced by TOKYO OHKA KOGYO CO., LTD., which was then diluted with ethanol.

Then, similarly as done in Inventive Example 2-2, the metal-based particle assembly film having the insulating layer as described above was provided at an outermost surface thereof with a coumarin-based light emitting layer to obtain a light emitting device.

Comparative Example 3-3

A light emitting device was produced similarly as done in Comparative Example 3-2 except that the insulating layer had an average thickness of 30 nm.

Comparative Example 3-4

A light emitting device was produced similarly as done in Comparative Example 3-2 except that the insulating layer had an average thickness of 80 nm.

Comparative Example 3-5

A light emitting device was produced similarly as done in Comparative Example 3-2 except that the insulating layer had an average thickness of 150 nm.

Comparative Example 3-6

A light emitting device was produced similarly as done in Comparative Example 3-2 except that the insulating layer had an average thickness of 350 nm.

Comparative Example 4

A light emitting device was produced similarly as done in Inventive Example 2-1 except that the metal-based particle assembly film was not provided.

Inventive Example 4-1

The same method as Inventive Example 2-1 was employed to provide on a 0.5 mm thick soda glass substrate the metal-based particle assembly film described in Inventive Example 2-1.

Then a solution for an $Alq_3$ light emitting layer was applied with spin-coating on the metal-based particle assembly film to form an $Alq_3$ light emitting layer having an average thickness of 30 nm. The solution for the $Alq_3$ light emitting layer was prepared by dissolving $Alq_3$ (Tris-(8-hydroxyquinoline)

aluminum from Sigma Aldrich Co. LLC.) in chloroform to have a concentration of 0.5% by weight.

Inventive Example 4-2

The same method as Inventive Example 2-2 was employed to provide a metal-based particle assembly film having an insulating layer with an average thickness of 10 nm and thereafter the same method as Inventive Example 4-1 was employed to form an $Alq_3$ light emitting layer having an average thickness of 30 nm to obtain a light emitting device.

Inventive Example 4-3

A light emitting device was produced similarly as done in Inventive Example 4-2 except that the insulating layer had an average thickness of 30 nm.

Inventive Example 4-4

A light emitting device was produced similarly as done in Inventive Example 4-2 except that the insulating layer had an average thickness of 80 nm.

Inventive Example 4-5

A light emitting device was produced similarly as done in Inventive Example 4-2 except that the insulating layer had an average thickness of 150 nm.

Comparative Example 5-1

The same method as Comparative Example 3-1 was employed to provide on a 1 mm thick soda glass substrate the metal-based particle assembly film described in Comparative Example 3-1 and thereafter the same method as Inventive Example 4-1 was employed to form an $Alq_3$ light emitting layer having an average thickness of 30 nm to obtain a light emitting device.

Comparative Example 5-2

The same method as Comparative Example 3-2 was employed to provide a metal-based particle assembly film having an insulating layer with an average thickness of 10 nm and thereafter the same method as Inventive Example 4-1 was employed to form an $Alq_3$ light emitting layer having an average thickness of 30 nm to obtain a light emitting device.

Comparative Example 5-3

A light emitting device was produced similarly as done in Comparative Example 5-2 except that the insulating layer had an average thickness of 30 nm.

Comparative Example 5-4

A light emitting device was produced similarly as done in Comparative Example 5-2 except that the insulating layer had an average thickness of 80 nm.

Comparative Example 5-5

A light emitting device was produced similarly as done in Comparative Example 5-2 except that the insulating layer had an average thickness of 150 nm.

Comparative Example 6

A light emitting device was produced similarly as done in Inventive Example 4-1 except that the metal-based particle assembly film was not provided.

Inventive Example 5-1

The same method as Inventive Example 2-1 was employed to provide on a 0.5 mm thick soda glass substrate the metal-based particle assembly film described in Inventive Example 2-1.

Then a solution for an F8BT light emitting layer was applied with spin-coating on the metal-based particle assembly film and subsequently annealed with a hot plate at 170° C. for 30 minutes to form an F8BT light emitting layer having an average thickness of 30 nm. The solution for the F8BT light emitting layer was prepared by dissolving F8BT (from Luminescence Technology Corp.) in chlorobenzene to have a concentration of 1% by weight.

Inventive Example 5-2

The same method as Inventive Example 2-2 was employed to provide a metal-based particle assembly film having an insulating layer with an average thickness of 10 nm and thereafter the same method as Inventive Example 5-1 was employed to form an F8BT light emitting layer having an average thickness of 30 nm to obtain a light emitting device.

Inventive Example 5-3

A light emitting device was produced similarly as done in Inventive Example 5-2 except that the insulating layer had an average thickness of 30 nm.

Comparative Example 7-1

The same method as Comparative Example 3-1 was employed to provide on a 1 mm thick soda glass substrate the metal-based particle assembly film described in Comparative Example 3-1 and thereafter the same method as Inventive Example 5-1 was employed to form an F8BT light emitting layer having an average thickness of 30 nm to obtain a light emitting device.

Comparative Example 7-2

The same method as Comparative Example 3-2 was employed to provide a metal-based particle assembly film-layered substrate having an insulating layer with an average thickness of 10 nm and thereafter the same method as Inventive Example 5-1 was employed to form an F8BT light emitting layer having an average thickness of 30 nm to obtain a light emitting device.

Comparative Example 7-3

A light emitting device was produced similarly as done in Comparative Example 7-2 except that the insulating layer had an average thickness of 30 nm.

Comparative Example 8

A light emitting device was produced similarly as done in Inventive Example 5-1 except that the metal-based particle assembly film was not provided.

Photoexcited light emitting devices of Inventive Examples 2-1, 2-2, 2-3, 2-4, 2-5, 2-6, Inventive Examples 3-1, 3-2, 3-3, 3-4, Inventive Examples 4-1, 4-2, 4-3, 4-4, 4-5, Inventive Examples 5-1, 5-2, 5-3, Comparative Examples 3-1, 3-2, 3-3, 3-4, 3-5, 3-6, Comparative Example 4, Comparative Examples 5-1, 5-2, 5-3, 5-4, 5-5, Comparative Example 6, Comparative Examples 7-1, 7-2, 7-3, and Comparative Example 8 were assessed for emission enhancement in level, as follows.

Figure 15A:
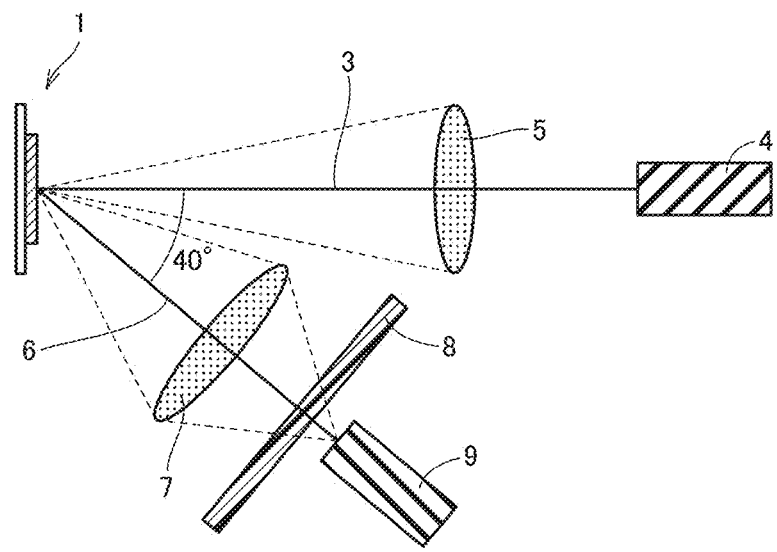
FIG. 15A schematically shows a system to measure an emission spectrum of a photoexcited light emitting device, and 15B is a schematic cross section view of a photoexcited light emitting device having a metal-based particle assembly film and an insulating layer.
Figure 15B:
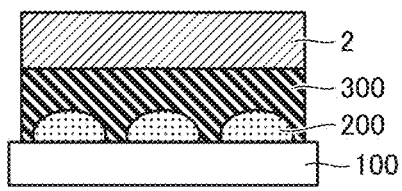

With reference to FIG. 15A showing a system employed to measure the photoexcited light emitting devices' emission spectra and FIG. 15B showing a schematic cross section view of a photoexcited light emitting device, a photoexcited light emitting device 1 was exposed at a light emitting layer 2 to excitation light 3 in a direction perpendicular to a surface of light emitting layer 2 to cause photoexcited light emitting device 1 to emit light. For an excitation light source 4 was used a UV-LED (UV-LED375-nano produced by SOUTH WALKER, excitation light wavelength: 375 nm). Radiated was excitation light 3 obtained by condensing the light emitted from excitation light source 4 through a lens 5. Light 6 emitted from photoexcited light emitting device 1 and radiated in a direction of 40 degrees relative to the optical axis of excitation light 3 was condensed by a lens 7 and then transmitted through a wavelength cut-off filter 8 (SCF-50S-44Y produced by SIGMA KOKI Co., LTD) to have the light of the wavelength of the excitation light cut and was then detected via a spectrophotometer 9 (MCPD-3000 produced by Otsuka Electronics Co., Ltd.). FIG. 15B is a schematic cross section view of photoexcited light emitting device 1 including a film of metal-based particle assembly 200, an insulating layer 300, and light emitting layer 2 in this order on substrate 100 of soda glass produced in the inventive and comparative examples.

From the spectra of the emissions detected, integrals were obtained for the emission wavelength ranges. The respective integrals obtained from each emission spectrum of the photoexcited light emitting devices of Inventive Examples 2-1, 2-2, 2-3, 2-4, 2-5, 2-6, Inventive Examples 3-1, 3-2, 3-3, 3-4, and Comparative Examples 3-1, 3-2, 3-3, 3-4, 3-5, 3-6 were divided by the integral obtained from an emission spectrum of the photoexcited light emitting device of Comparative Example 4 to obtain "emission enhancement magnification", as represented in FIG. 16 along the axis of ordinate.

Figure 17:
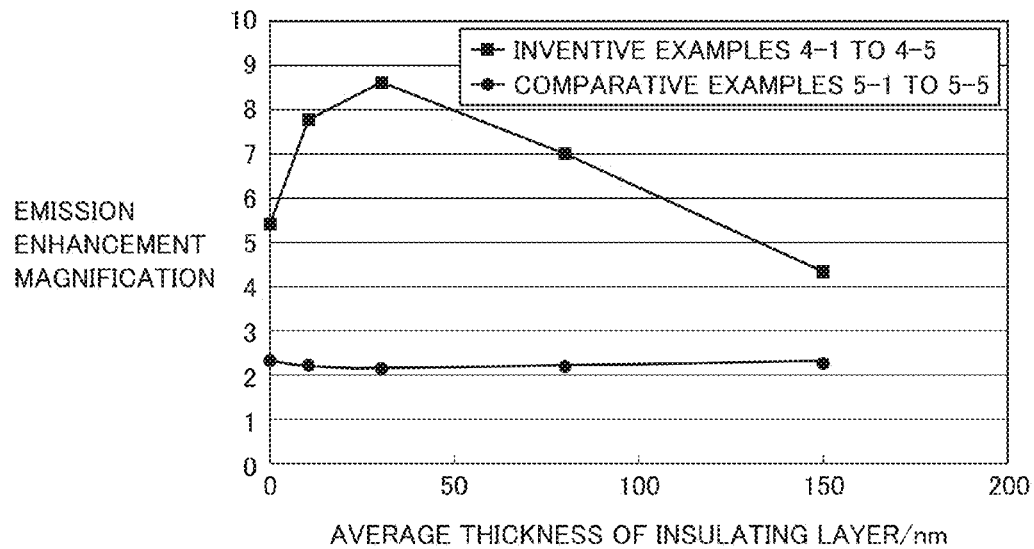
FIG. 17 compares emission enhancement effects in photoexcited light emitting devices of Inventive Examples 4-1 to 4-5 with emission enhancement effects in photoexcited light emitting devices of Comparative Examples 5-1 to 5-5.

The respective integrals obtained from each emission spectrum of the photoexcited light emitting devices of Inventive Examples 4-1, 4-2, 4-3, 4-4, 4-5, and Comparative Examples 5-1, 5-2, 5-3, 5-4, 5-5 were divided by the integral obtained from an emission spectrum of the photoexcited light emitting device of Comparative Example 6 to obtain "emission enhancement magnification", as represented in FIG. 17 along the axis of ordinate.

Figure 18:
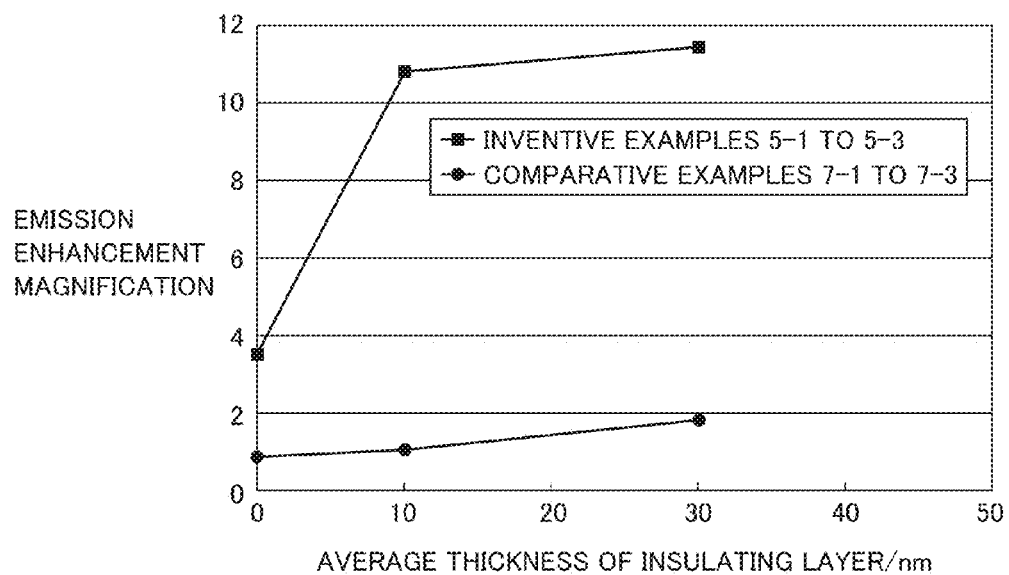
FIG. 18 compares emission enhancement effects in photoexcited light emitting devices of Inventive Examples 5-1 to 5-3 with emission enhancement effects in photoexcited light emitting devices of Comparative Examples 7-1 to 7-3.

The respective integrals obtained from each emission spectrum of the photoexcited light emitting devices of Inventive Examples 5-1, 5-2, 5-3 and Comparative Examples 7-1, 7-2, 7-3 were divided by the integral obtained from an emission spectrum of the photoexcited light emitting device of Comparative Example 8 to obtain "emission enhancement magnification", as represented in FIG. 18 along the axis of ordinate.

Figure 16:
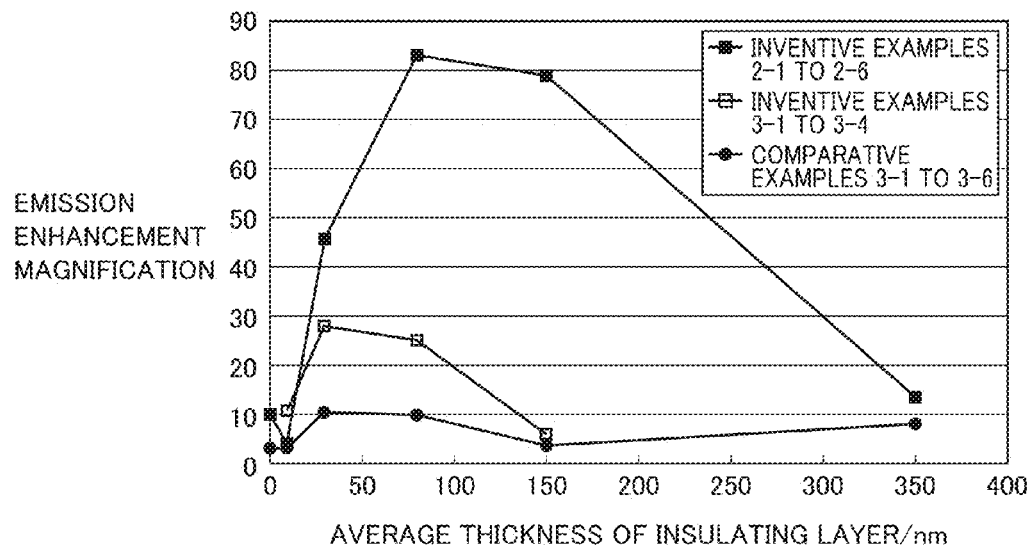
FIG. 16 compares emission enhancement effects in photoexcited light emitting devices of Inventive Examples 2-1 to 2-6 and Inventive Examples 3-1 to 3-4 with emission enhancement effects in photoexcited light emitting devices of Comparative Examples 3-1 to 3-6.

As shown in FIG. 16 to FIG. 18, as the metal-based particle assembly of Inventive Example 2-1 presents intense plasmon resonance, a light emitting device including it presented a significant emission enhancement effect regardless of what type of luminescent material configures the light emitting layer. Furthermore, as the plasmon resonance has an effect over a significantly extended range (or a plasmonic enhancement effect covering the range), the light emitting device is also observed to have an emission enhancement effect with an insulating layer having a large thickness of 350 nm.

While the metal-based particle assembly of Inventive Example 3-1 presented a plasmon peak (a peak at a longest side in wavelength in an absorption spectrum) with a relatively low absorbance, it presented a plasmon scattering peak having a scattering intensity ratio of 15% or higher (33.5%) and was thus observed to provide a sufficiently large emission enhancement effect. Furthermore, it was also observed to present plasmon resonance having an effect over an extended range, and thus also had an emission enhancement effect with an insulating layer having a large thickness of 80 nm.

[Producing Organic EL Device and Assessing Emission Intensity]

Inventive Example 6

Silver particles were grown under the same conditions as Inventive Example 1 to provide on a 0.5 mm thick soda glass substrate the metal-based particle assembly film described in Inventive Example 1. Thereafter immediately a spin-on glass (SOG) solution was applied with spin-coating on the metal-based particle assembly film to have an insulating layer having an average thickness of 80 nm layered thereon. For the SOG solution was used "OCD T-7 5500T", an organic SOG material produced by TOKYO OHKA KOGYO CO., LTD., which was then diluted with ethanol.

Then ion sputtering was employed to layer an anode electrode that is an IZO layer (thickness: 22 nm) on the insulating layer and thereafter a hole injection layer forming solution was applied with spin-coating on the anode electrode to layer a hole injection layer having an average thickness of 20 nm. For the hole injection layer forming solution was used a product of PLEXTRONICS Inc. having a product name "Plexcore AQ 1200" which was then diluted with ethanol to have a prescribed concentration. The insulating layer, the anode electrode, and the hole injection layer have a total average thickness of 122 nm (i.e., an average distance from a surface of the metal-based particle assembly film to the light emitting layer is 122 nm).

Subsequently, a polymeric luminophor soluble in an organic solvent was dissolved in the organic solvent at a prescribed concentration, and this solution was applied with spin-coating on the hole injection layer to provide a 100 nm thick light emitting layer. Then, vacuum deposition was employed to deposit an electron injection layer that is a NaF layer (of 2 nm thick), a cathode electrode that is an Mg layer (of 2 nm thick) and an Ag layer (of 10 nm thick) in that order on the light emitting layer. The obtained device had a front surface sealed with a sealant ("XNR5516ZLV", a UV curable resin produced by Nagase Chemtex Corp.) to obtain an organic EL device.

Comparative Example 9

An organic EL device was produced similarly as done in Inventive Example 6 except that the metal-based particle assembly film was not provided.

A source meter (a source meter type 2602A produced by Keithley Instruments Inc.) was used to apply a voltage of 15 V to the organic EL device of Inventive Example 6 constantly to cause the device to emit light with a current having a value of 2.3 mA passing between the electrodes. The emission spectrum was measured with "CS-2000", a spectrometric device produced by Konica Minolta Co., Ltd., and the obtained emission spectrum was integrated for a visible light wavelength range to obtain emission intensity. The emission intensity of the organic EL device of Comparative Example 9 was also obtained, similarly as done for the organic EL device of Inventive Example 6 (the same voltage of 15 V as the organic EL device of Inventive Example 6 was applied), except that a current having a value of 2.7 mA was passed between the electrodes. As a result, it has been confirmed that the organic EL device of Inventive Example 6 exhibits an emission intensity approximately 3.8 times that of the organic EL device of Comparative Example 9.

Inventive Example 7

Silver particles were grown under the same conditions as Inventive Example 1 to provide on a 0.5 mm thick soda glass substrate the metal-based particle assembly film described in Inventive Example 1. Thereafter immediately a spin-on glass (SOG) solution was applied with spin-coating on the metal-based particle assembly film to have an insulating layer having an average thickness of 30 nm layered thereon. For the SOG solution was used "OCD T-7 5500T", an organic SOG material produced by TOKYO OHKA KOGYO CO., LTD., which was then diluted with ethanol.

Then ion sputtering was employed to layer an anode electrode that is an IZO layer (thickness: 22 nm) on the insulating layer and thereafter a hole injection layer forming solution was applied with spin-coating on the anode electrode to layer a hole injection layer having an average thickness of 20 nm. For the hole injection layer forming solution was used a product of PLEXTRONICS Inc. having a product name "Plexcore AQ 1200" which was then diluted with ethanol to have a prescribed concentration. The insulating layer, the anode electrode, and the hole injection layer have a total average thickness of 72 nm (i.e., an average distance from a surface of the metal-based particle assembly film to the light emitting layer is 72 nm).

Subsequently, vacuum deposition was employed to deposit on the hole injection layer a light emitting layer that is $Alq_3$ of 80 nm. Then, vacuum deposition was employed to deposit an electron injection layer that is a NaF layer (of 2 nm thick), a cathode electrode that is an Mg layer (of 2 nm thick) and an Ag layer (of 10 nm thick) in that order on the light emitting layer. The obtained device had a front surface sealed with a sealant ("XNR5516ZLV", a UV curable resin produced by Nagase Chemtex Corp.) to obtain an organic EL device.

Comparative Example 10

An organic EL device was produced similarly as done in Inventive Example 7 except that the metal-based particle assembly film was not provided.

A source meter (a source meter type 2602A produced by Keithley Instruments Inc.) was used to apply a voltage of 11 V to the organic EL device of Inventive Example 7 constantly to cause the device to emit light with a current having a value of 0.7 mA passing between the electrodes. The emission spectrum was measured with "CS-2000", a spectrometric device produced by Konica Minolta Co., Ltd., and the obtained emission spectrum was integrated for a visible light wavelength range to obtain emission intensity. The emission intensity of the organic EL device of Comparative Example 10 was also obtained, similarly as done for the organic EL device of Inventive Example 7 (the same voltage of 11 V as the organic EL device of Inventive Example 7 was applied), except that a current passed between the electrodes was adjusted to have a value of 1.1 mA. As a result, it has been confirmed that the organic EL device of Inventive Example 7 exhibits an emission intensity approximately 2.6 times that of the organic EL device of Comparative Example 10.

REFERENCE SIGNS LIST

1: photoexcited light emitting device; 2: light emitting layer; 3: excitation light; 4: excitation light source; 5, 7: lens; 6: light emitted from photoexcited light emitting device; 8: wavelength cut off filter; 9: spectrophotometer; 100: substrate; 200: metal-based particle assembly; 300: insulating layer; 400: barium sulfate layer; 500: incident light; 510, 520: light scattered from incident light at an angle of 30°.

The invention claimed is:

1. A metal-based particle assembly comprising 30 or more metal-based particles separated from each other and disposed in two dimensions,
    said metal-based particles having an average particle diameter in a range of from 200 to 1600 nm, an average height in a range of from 55 to 500 nm, and an aspect ratio, as defined by a ratio of said average particle diameter to said average height, in a range of from 1 to 8,
    the metal-based particle assembly having a scattering intensity ratio $S_1/S_0$ equal to or larger than 0.15, $S_1$ representing a scattering intensity at a maximum wavelength of a peak having a highest peak intensity, as observed in a scattering spectrum of light scattered at an angle of 30° from light incident on a surface of the metal-based particle assembly along a normal to the surface, $S_0$ representing a scattering intensity of said peak for a reference system made of a barium sulfate layer.

2. The metal-based particle assembly according to claim 1, wherein said metal-based particles are oblate particles with said aspect ratio of more than one.

3. The metal-based particle assembly according to claim 1, wherein said metal-based particles are made of silver.

4. The metal-based particle assembly according to claim 1, wherein said metal-based particles are non-conductive between adjacent metal-based particles.

5. A metal-based particle assembly film-layered substrate comprising: a substrate; and a film composed of the metal-based particle assembly according to claim 1 and layered on said substrate.

6. The metal-based particle assembly film-layered substrate according to claim 5, having in an absorption spectrum for a visible light region a maximum wavelength of a peak at a longest side in wavelength, the maximum wavelength being in a range of from 350 to 550 nm.

7. The metal-based particle assembly film-layered substrate according to claim 5, having in an absorption spectrum for a visible light region a maximum wavelength of a peak at a longest side in wavelength, an absorbance at the maximum wavelength being at least one.

8. The metal-based particle assembly film-layered substrate according to claim 5, further comprising an insulating layer covering a surface of each metal-based particle that composes said film.

9. An optical device comprising: an active layer having the thickness of at least 10 nm; and the metal-based particle assembly according to claim 1.

10. The optical device according to claim 9, wherein a maximum wavelength of at least one peak in an emission spectrum or an absorption spectrum that said active layer presents and said maximum wavelength in said scattering spectrum that said metal-based particle assembly presents have a difference in absolute value of equal to or smaller than 200 nm.

* * * * *